(12) United States Patent
Wirth et al.

(10) Patent No.: US 7,144,813 B2
(45) Date of Patent: Dec. 5, 2006

(54) METHOD AND APPARATUS FOR THERMALLY PROCESSING MICROELECTRONIC WORKPIECES

(75) Inventors: Paul Zachary Wirth, Columbia Falls, MT (US); Jeffry Alan Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/987,049

(22) Filed: Nov. 12, 2004

(65) Prior Publication Data

US 2006/0105580 A1    May 18, 2006

(51) Int. Cl.
*H01L 21/302* (2006.01)
(52) U.S. Cl. .................. 438/689; 414/217; 219/388; 256/345.32; 438/908; 438/907
(58) Field of Classification Search ............... 438/907, 438/908, 943; 219/388, 389, 393, 396, 443.3, 219/444.1; 156/345.32, 345.37, 345.31; 414/149, 161, 217, 935, 939
See application file for complete search history.

(56) References Cited

U.S. PATENT DOCUMENTS

| | | | | |
|---|---|---|---|---|
| 4,118,016 A | * | 10/1978 | Westeren et al. | ........... 266/130 |
| 4,480,822 A | * | 11/1984 | Mauratelli | ................... 266/256 |
| 4,909,314 A | * | 3/1990 | Lamont, Jr. | ................ 165/80.3 |
| 5,942,175 A | * | 8/1999 | Curran et al. | ............... 264/112 |
| 6,465,844 B1 | * | 10/2002 | Saito et al. | .................. 257/336 |
| 6,860,965 B1 | * | 3/2005 | Stevens | ................. 156/345.32 |
| 2005/0063800 A1 | * | 3/2005 | Kurita et al. | ............... 414/217 |
| 2005/0118432 A1 | * | 6/2005 | Bisazza et al. | ............. 428/432 |

\* cited by examiner

*Primary Examiner*—Thao P. Le
(74) *Attorney, Agent, or Firm*—Perkins Coie LLP

(57) ABSTRACT

An apparatus for thermally processing a microelectronic workpiece is provided. The apparatus comprises a rotatable carousel assembly configured to support at least one workpiece. A driver is coupled to the carousel assembly and rotates the carousel assembly, moving the workpiece between a loading station, a heating station and a cooling station. The loading, heating and cooling stations are radially positioned and approximately equally spaced about a center axis of the carousel assembly. The heating station includes a heating element and an actuator for moving the heating element into thermal engagement with the workpiece in the heating station. The cooling station includes a cooling element and an actuator for moving the cooling element into thermal engagement with the workpiece in the cooling station. A process fluid distribution manifold for delivering process fluid to the workpieces at each station extends through a central opening in the carousel assembly. A non-oxidizing gas is delivered through the manifold to create an oxygen free environment during the thermal process.

66 Claims, 18 Drawing Sheets

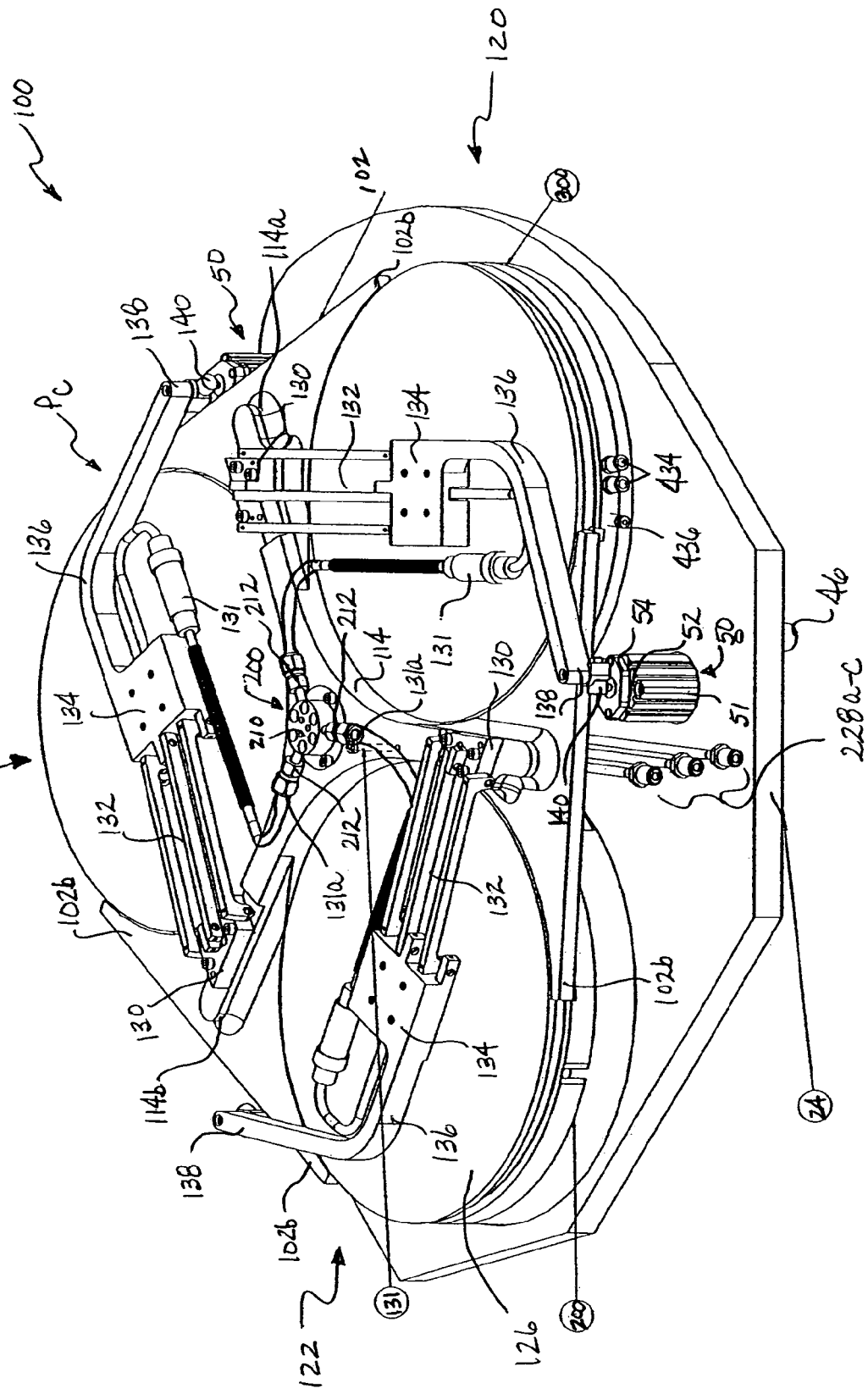

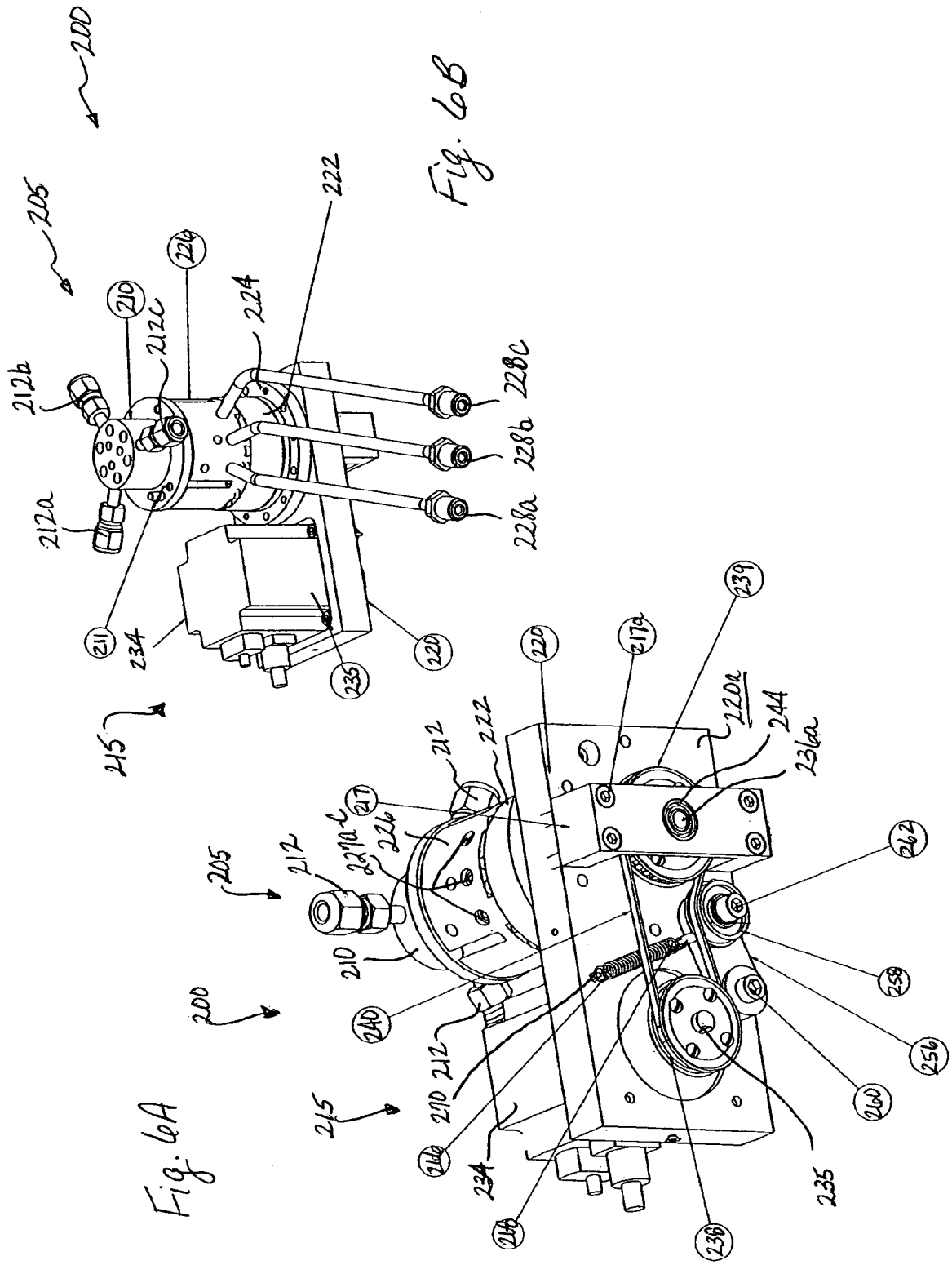

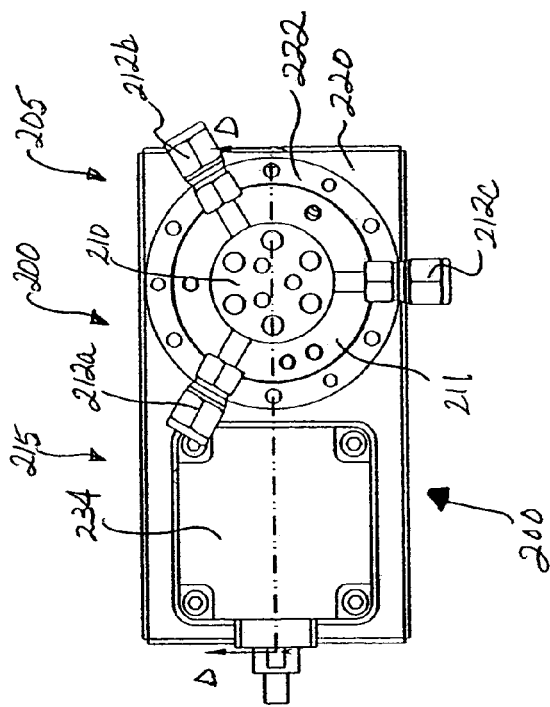
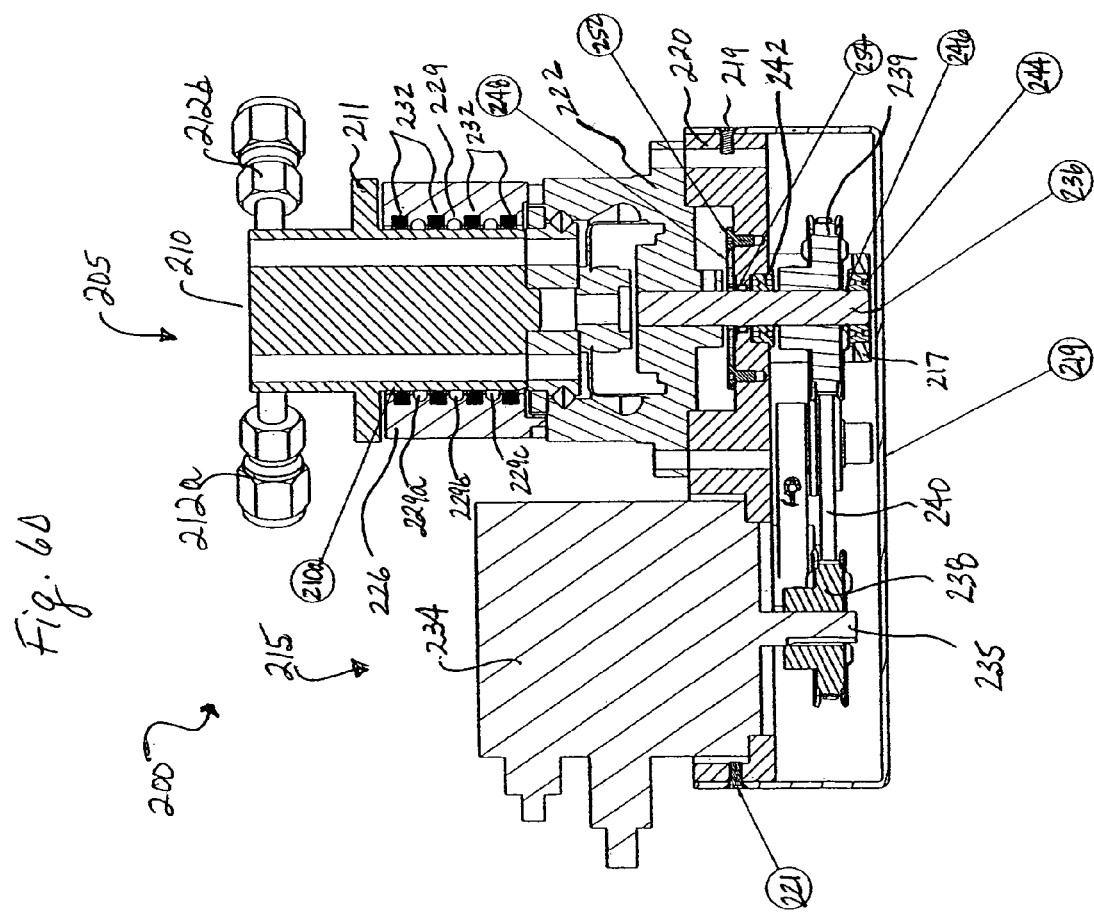
Fig. 6c
Fig. 6b

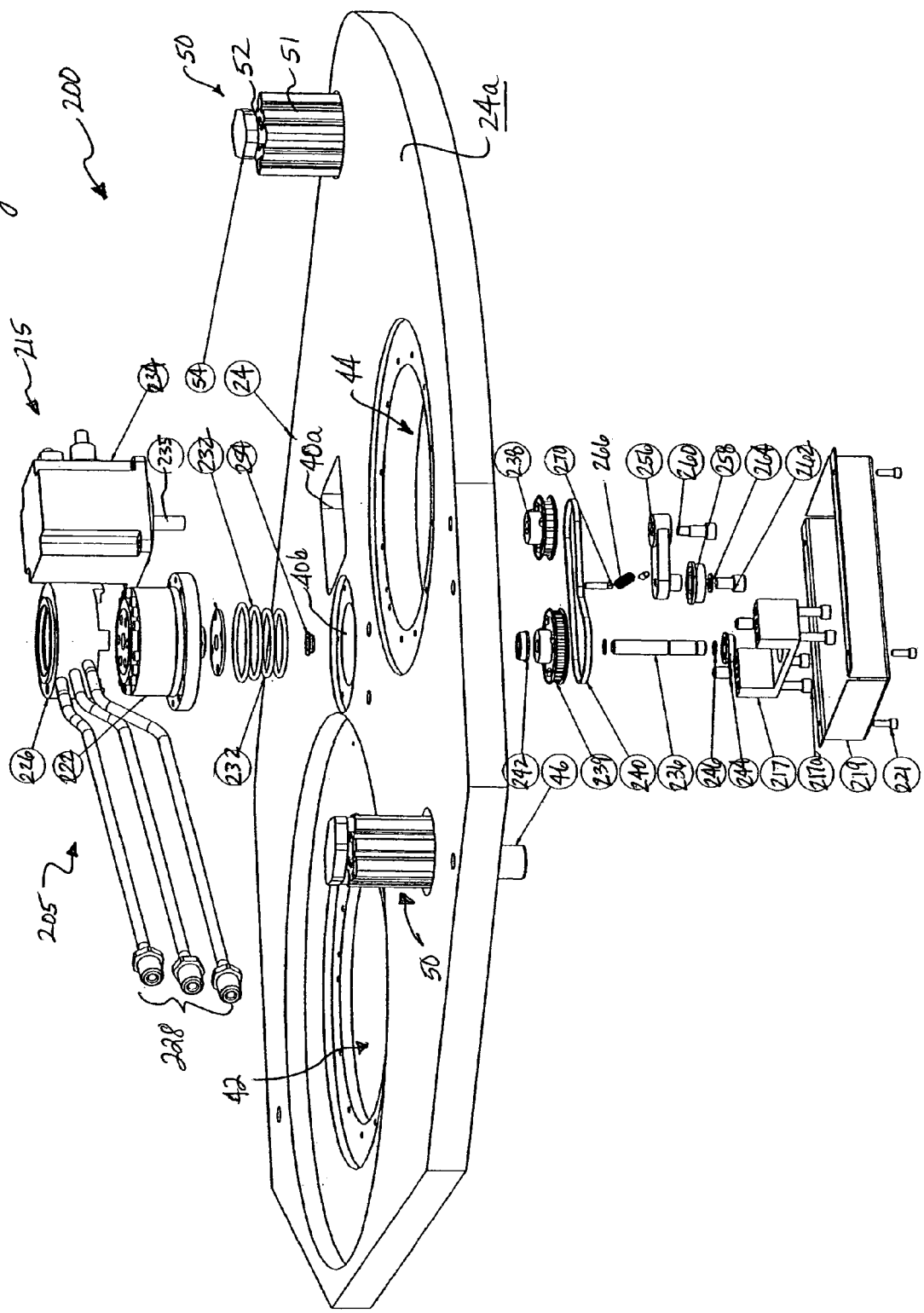

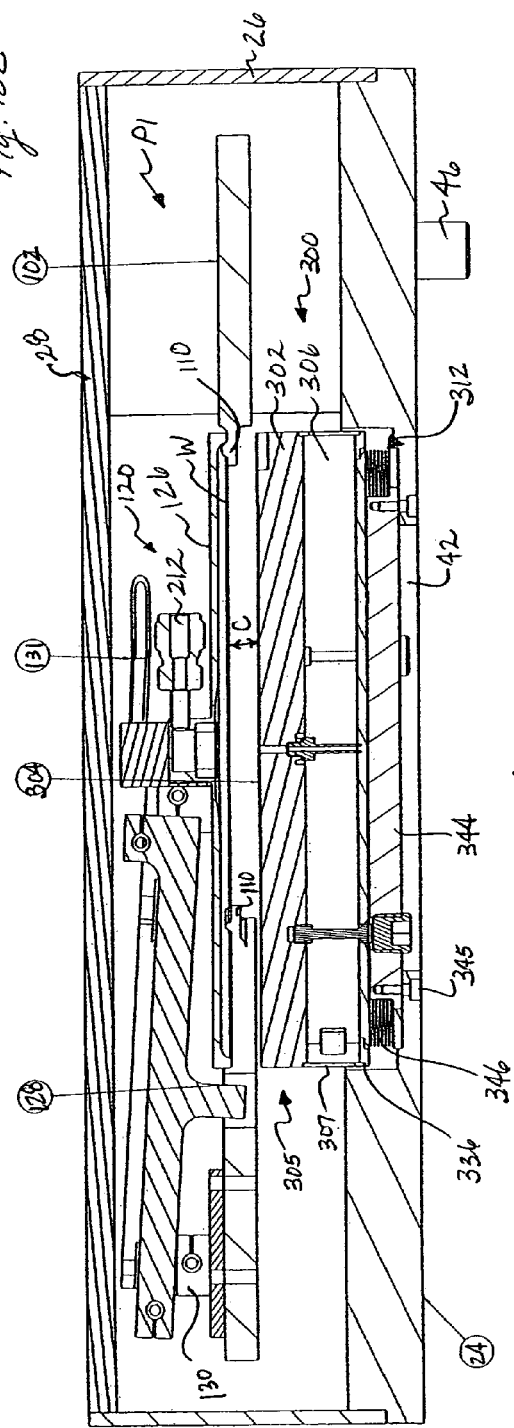

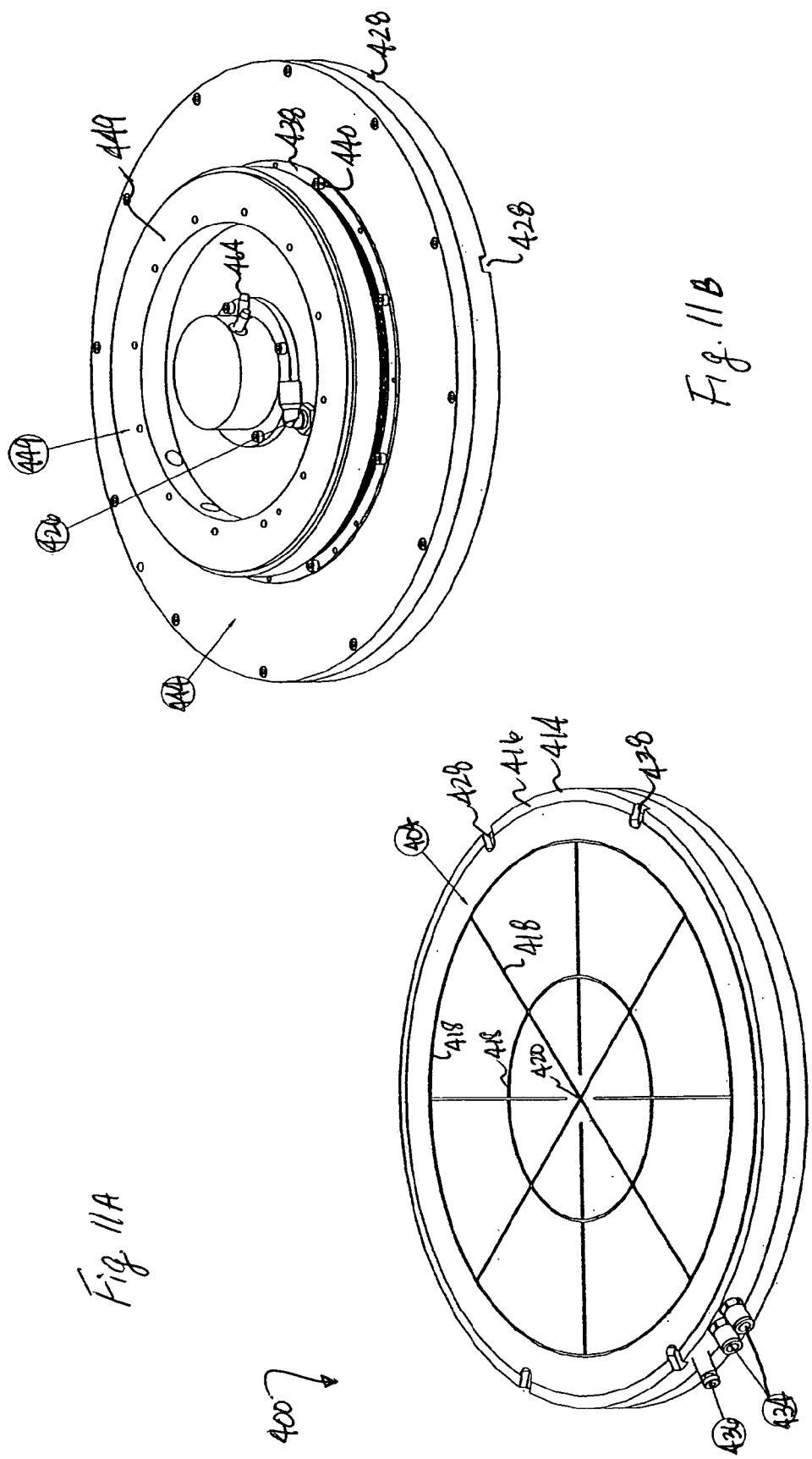

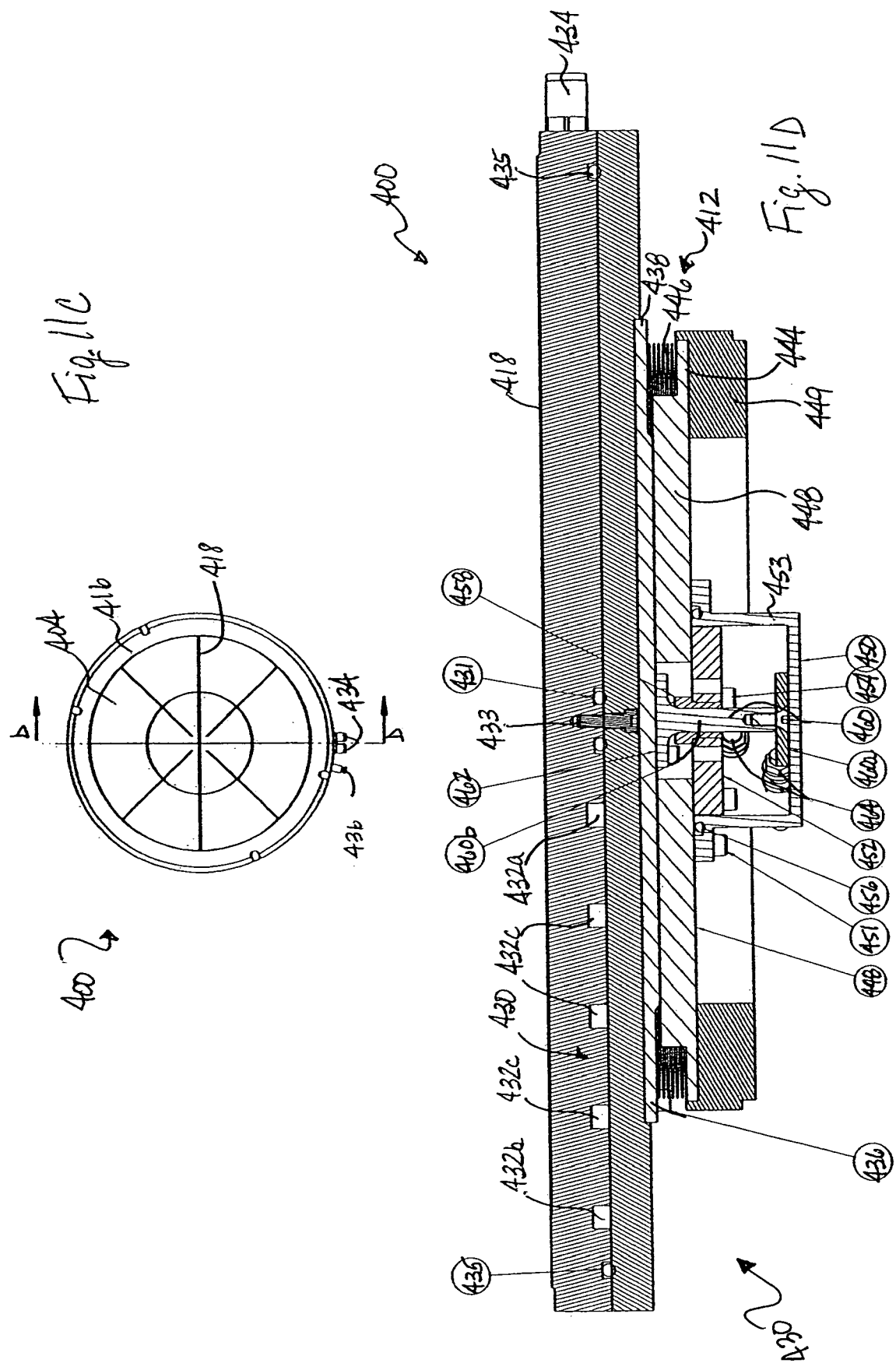

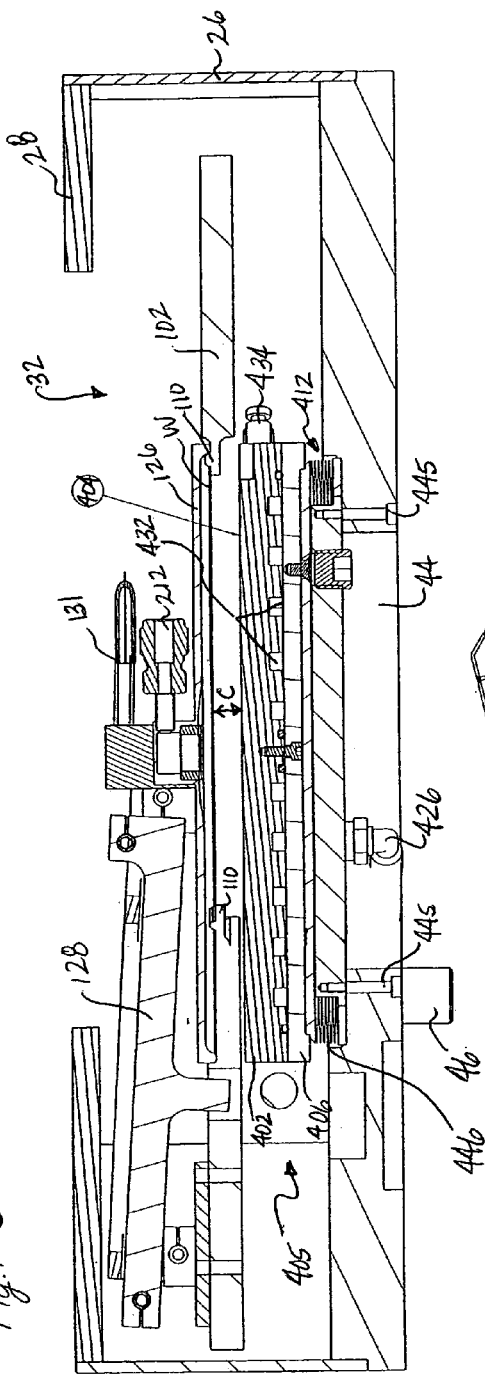
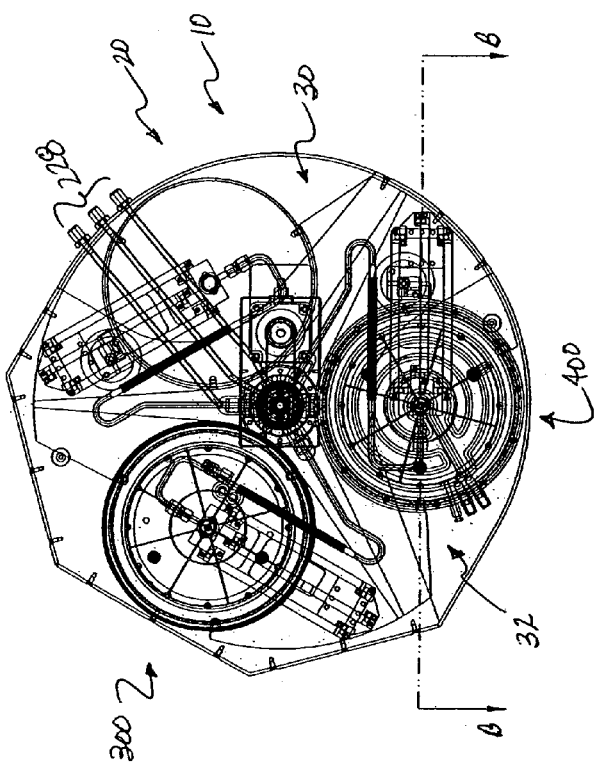
Fig. 12B
Fig. 12A

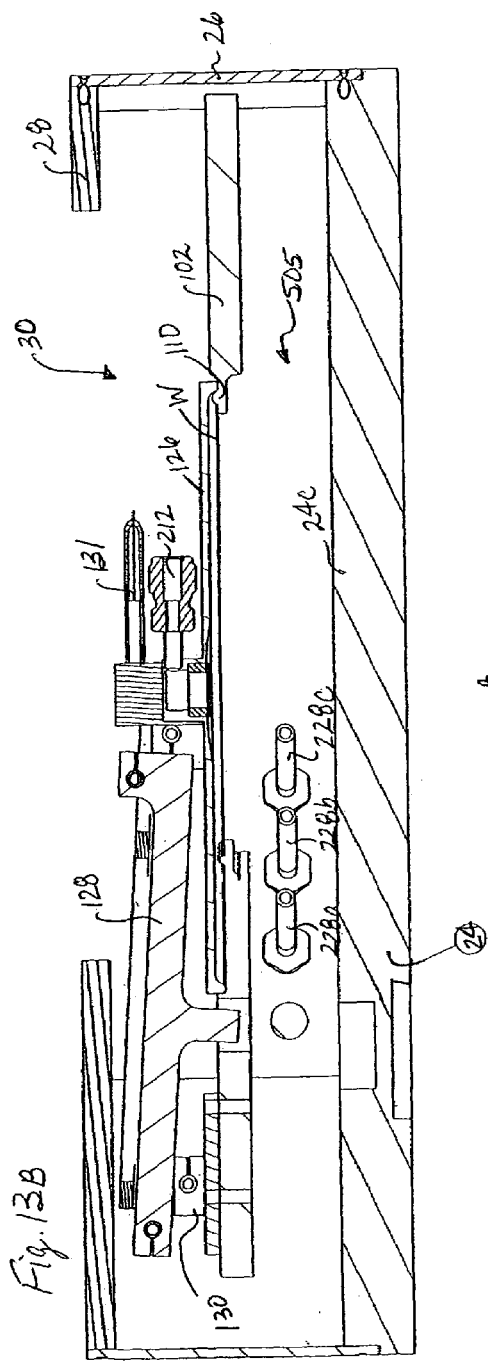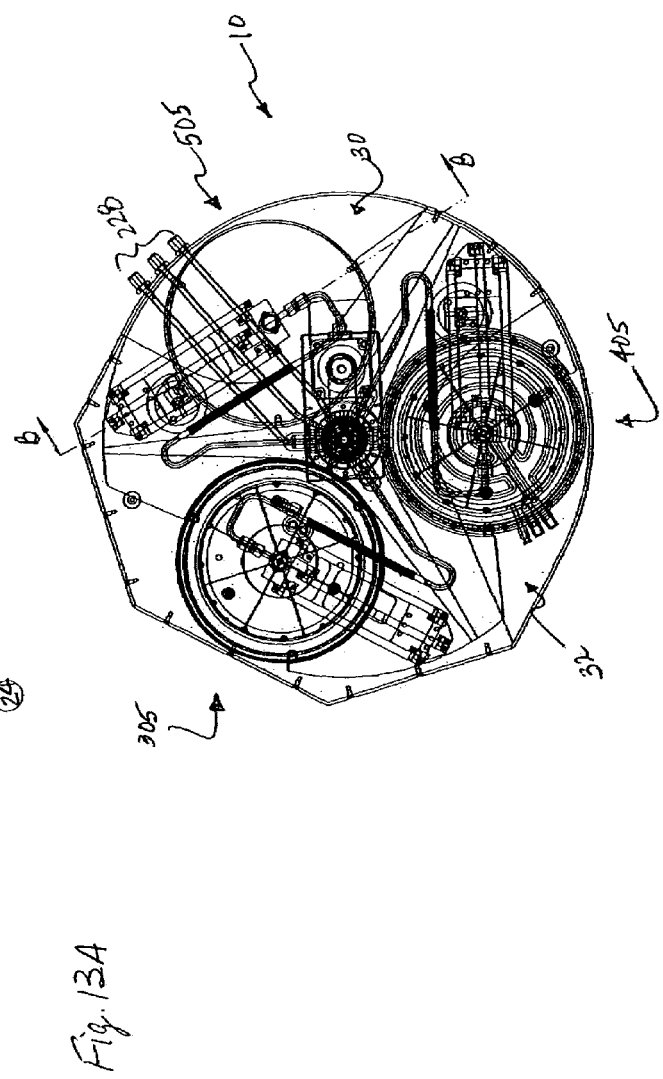
Fig. 13B
Fig. 13A

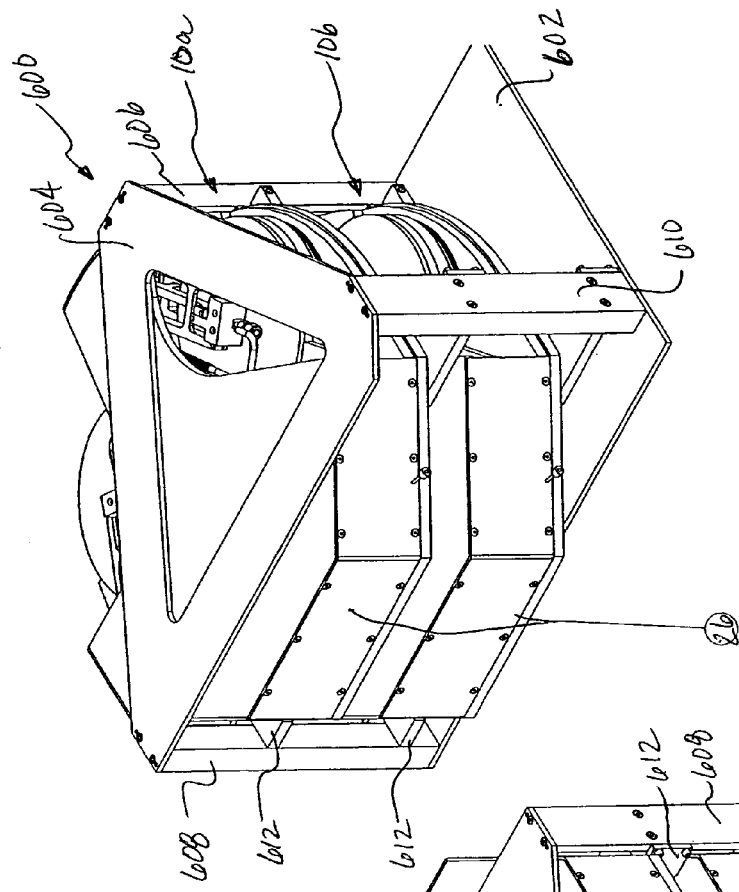
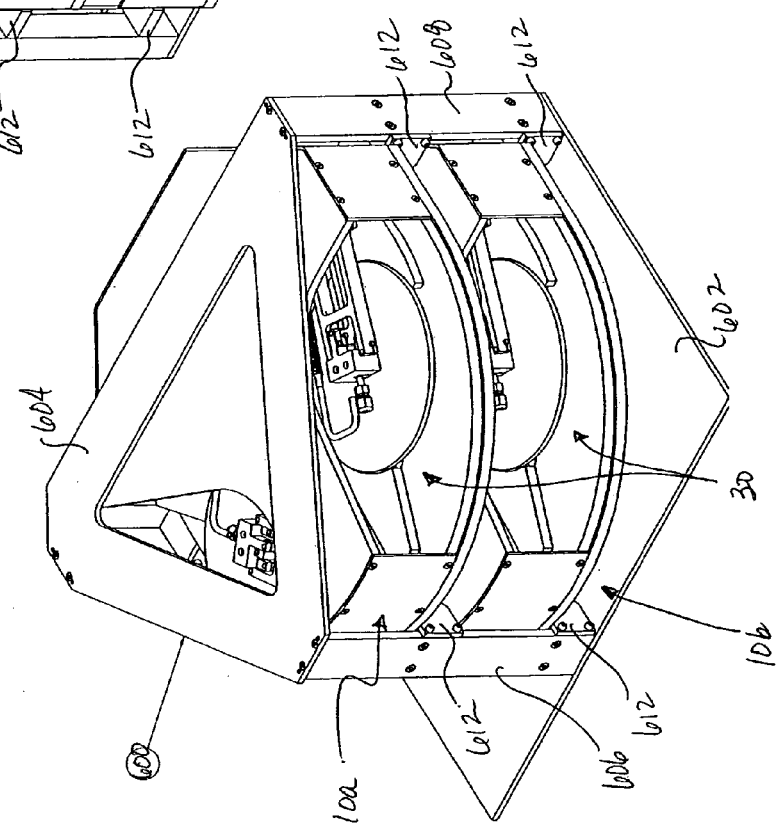
Fig. 14A
Fig. 14B

METHOD AND APPARATUS FOR THERMALLY PROCESSING MICROELECTRONIC WORKPIECES

CROSS-REFERENCE TO RELATED APPLICATIONS

Not Applicable.

TECHNICAL FIELD

The present invention is generally directed to a method and apparatus for thermally processing one or more microelectronic workpieces. More specifically, the apparatus includes a carousel assembly that rotates the workpiece between a loading station, a heating station and a cooling station positioned radially outwardly from a central axis of the carousel assembly.

BACKGROUND OF THE INVENTION

In the production of semiconductor integrated circuits and other microelectronic articles from microelectronic workpieces, such as semiconductor wafers, it is often necessary to provide multiple metal layers on a substrate to serve as interconnect metallization that electrically connects the various devices on the integrated circuit to one another. Traditionally, aluminum has been used for such interconnects, however, it is now recognized that copper metallization may be preferable. Copper interconnects can help alleviate many of the problems experienced in connection with the current aluminum technology.

The microelectronic fabrication industry has sought to use copper as the interconnect metallization by using a damascene and/or patterned plating electroplating process where holes, more commonly called vias, trenches and other recesses are used to produce the desired copper patterns. In the damascene process, the wafer is first provided with a metallic seed layer and barrier/adhesion layer that are disposed over a dielectric layer into which trenches are formed. The seed layer is used to conduct electrical current during a subsequent metal electroplating step. Preferably, the seed layer is a very thin layer of metal that can be applied using one of several processes. For example, the seed layer of metal can be laid down using physical vapor deposition or chemical vapor deposition processes to produce a layer on the order of 1000 angstroms thick. The seed layer can also be formed of copper, gold, nickel, palladium, and most or all other metals. The seed layer is formed over a surface that is convoluted by the presence of the trenches, or other device features, which are recessed into the dielectric substrate.

In single damascene processes using electroplating, a process employing two electroplating operations is generally employed. First, a copper layer is electroplated onto the seed layer in the form of a blanket layer. The blanket layer is plated to an extent which forms an overlying layer, with the goal of completely providing a copper layer that fills the trenches that are used to form the horizontal interconnect wiring in the dielectric layer. The first blanket layer is then subject, for example, to a chemical mechanical polish step in which the portions of the layer extending above the trenches are removed, leaving only the trenches filled with copper. A further dielectric layer is then provided to cover the wafer surface and recessed vias are formed in the further dielectric layer. The recessed vias are disposed to overlie certain of the filled trenches. A further seed layer is applied and a further electroplated copper blanket layer are provided that extend over the surface of the further dielectric layer and fills the vias. Again, copper extending above the level of the vias is removed using, for example, chemical mechanical polishing techniques. The vias thus provide a vertical connection between the original horizontal interconnect layer and a subsequently applied horizontal interconnect layer. Electrochemical deposition of copper films has thus become an important process step in the manufacturing of high-performance microelectronic products.

Alternatively, the trenches and vias may be etched in the dielectric at the same time in what is commonly called a "dual damascene" process. These features are then processed, as above, with barrier layer, seed layer and fill/blanket layer that fill the trenches and vias disposed at the bottoms of the trenches at the same time. The excess material is then polished, as above, to produce inlaid conductors.

The metallurgical properties of the copper metallization can be quite important as the metal structures are formed. This is particularly true in connection with the impact of the metallurgical properties of the copper metallization during chemical mechanical polishing. Wafer-to-wafer and within wafer grain size variability in the copper film can adversely affect the polish rate of the chemical mechanical processing as well as the ultimate uniformity of the surfaces of the polished copper structures. Large grain size and low variations in grain size in the copper film are very desirable.

The electrical properties of the copper metallization are also important to the performance of the associated microelectronic device. Such devices may fail if the copper metallization exhibits excessive electromigration that ultimately results in an open or short circuit condition in one or more of the metallization structures. One factor that has a very large influence on the electromigration resistance of sub-micron metal layers is the grain size of the deposited metal. This is because grain boundary migration occurs with a much lower activation energy than trans-granular migration.

To achieve the desired electrical characteristics for the copper metallization, the grain structure of each deposited blanket layer is altered through an annealing process. This annealing process is traditionally thought to require the performance of a separate processing step at which the semiconductor wafer is subject to an elevated temperature of about 400 degrees Celsius. Generally, there are two types of annealing apparatus that are presently available. The first type is a stand-alone batch unit that is often designed for batch processing of wafers disposed in wafer boats. The second type of annealing apparatus is generally designed to heat and cool a wafer in a single process chamber. These conventional thermal processing units present a number of drawbacks. First, the cost of batch equipment is higher due to the extra components to handle workpiece transport. Further, batch thermal processing typically requires massive heating and cooling elements, which typically require relatively long periods of time in order to change from one temperature and come to equilibrium at a new temperature. Moreover, a large amount of energy is required to heat and cool the massive elements. Heating and cooling in a single process chamber takes relatively long periods of time, reducing the throughput of the manufacturing process. Finally, exposing heating and cooling elements to repetitive temperature cycling leads to process equipment fatigue and eventually failure.

The present inventors have recognized substantial improvements over the foregoing processes and apparatus currently suitable for thermal processing metal microstructures. To this end, the inventors have developed an improved thermal processing apparatus that may be readily integrated into a processing tool incorporating a number of other processing reactors, including, for example, an electroplating reactor. The apparatus and methods developed by the inventors provide substantial improvements over the foregoing processes and apparatus currently utilized in thermal processing metal microelectronic structures.

SUMMARY OF THE INVENTION

The present invention provides a method and an apparatus for thermally processing a microelectronic workpiece. The apparatus includes a rotatable carousel assembly that is configured to support at least one workpiece. The apparatus further includes a loading station, a heating station, a cooling station for thermal processing of the workpiece. A driver is coupled to the carousel assembly for rotation of the carousel assembly, wherein the workpiece is moved between the loading, heating and cooling stations. By separating the stations, heating and cooling elements may remain at relatively constant temperatures significantly improving equipment reliability and reducing the throughput time of the thermal process.

According to another aspect of the invention, the thermal processing apparatus includes a carousel assembly rotatable about a central axis. The carousel assembly has a frame configured to support a plurality of workpieces in substantially horizontal arrangement. The apparatus further includes a heating station and a cooling station, wherein the heating and cooling stations are positioned radially outwardly from the central axis. A driver is coupled to the carousel assembly for rotation of the carousel assembly whereby the workpieces are selectively rotated between the heating station and the cooling station. Because the carousel assembly of the present invention allows multiple workpieces to be processed at the same time, increased manufacturing efficiencies may be achieved.

According to yet another aspect of the invention, the thermal processing apparatus includes a process fluid distribution system coupled to a carousel assembly. The carousel assembly is configured to hold a plurality of workpieces and sequentially rotate each workpiece from a loading station, a heating station and a cooling station. The process fluid distribution system independently delivers a process fluid to the carousel assembly for distribution to each workpiece at the loading, heating and cooling stations. As a result, wafers can be maintained in an environment free from oxygen throughout the entire thermal process, reducing the risk of unwanted oxides being formed on the wafer.

According to another aspect of the present invention, a method of thermally processing a microelectronic workpiece is provided. A first workpiece is loaded into a carousel assembly configured to hold a plurality of workpieces. The carousel assembly rotates, moving the first workpiece to a heating station where a heating element is moved into thermal engagement with the first workpiece. The first workpiece is heated and a second workpiece is loaded into the carousel assembly. Once the first workpiece is raised to a desired temperature, the carousel assembly rotates again, moving the first workpiece to a cooling station and the second workpiece to the heating station. A cooling element is moved into thermal engagement with the heated first workpiece; the heating element is moved into thermal engagement with the second workpiece; and a third workpiece is loaded into the carousel assembly. Once the first workpiece is cooled to a desired temperature and the second workpiece is heated to a desired temperature, the first workpiece is removed from the carousel assembly. The carousel assembly then rotates again, moving the second and third workpieces to the cooling and heating stations, respectively. A fourth workpiece is loaded into the carousel assembly and the thermal process continues. The continuous process allows for an efficient and uniform transfer of thermal energy to the workpieces, resulting in increased throughput, more efficient energy expenditures and improved equipment reliability.

BRIEF DESCRIPTION OF THE DRAWINGS

FIG. 2 is a perspective view of the apparatus of FIG. 1, showing a carousel assembly operably connected to a housing of the chamber with the cover of the housing removed;

FIG. 6A is a perspective view of a driver and process fluid distribution system found in the apparatus of FIG. 1, showing an underside of the system;

FIG. 6B is a perspective view of the driver and process fluid distribution system found in the apparatus of FIG. 1;

FIG. 6C is a plan view of the driver and process fluid distribution system found in the apparatus of FIG. 1;

FIG. 6D is a cross-section of the driver and process fluid distribution system found in the apparatus of FIG. 1, taken along line D—D of FIG. 6C;

FIG. 7 is an exploded view of the driver and process fluid distribution system found in the apparatus of FIG. 1;

FIG. 10A is a plan view of the of the apparatus of FIG. 1;

FIG. 10B is a cross-section of the apparatus of FIG. 1 taken along line B—B of FIG. 10A, showing a heating station;

FIG. 11A is a perspective view of a cooling element of the apparatus of FIG. 1;

FIG. 11B is a perspective view of the cooling element of FIG. 11A, showing an underside of the cooling element;

FIG. 11C is a plan view of the cooling element of FIG. 11A;

FIG. 11D is a cross-section of the cooling element of FIG. 11A taken along line D—D of FIG. 11C;

FIG. 12A is a plan view of the apparatus of FIG. 1;

FIG. 12B is a cross-section of the apparatus of FIG. 1 taken along line B—B of FIG. 12A, showing a cooling station;

FIG. 13A is a plan view of the apparatus of FIG. 1;

FIG. 13B is a cross-section of the apparatus of FIG. 1 taken along line B—B of FIG. 13A, showing a loading station;

FIG. 14A is a perspective view of the annealing chambers of FIG. 1, showing a front portion of the chambers in a stacked configuration; and, FIG. 14B is a perspective view of the annealing chambers of FIG. 1, showing a rear portion of the chambers in a stacked configuration.

DETAILED DESCRIPTION

For purposes of the present application, a microelectronic workpiece is defined to include a workpiece formed from a substrate upon which microelectronic circuits or components, data storage elements or layers, and/or micromechanical elements are formed. Although the present invention is applicable to this wide range of products, the invention will be particularly described in connection with its use in the production of interconnect structures formed during the production of integrated circuits on a semiconductor wafer. Still further, although the invention is applicable for use in connection with a wide range of metal and metal alloys as well as in connection with a wide range of elevated temperature processes, the invention will be particularly described in connection with annealing of electroplated copper and copper alloys.

Figure 1:
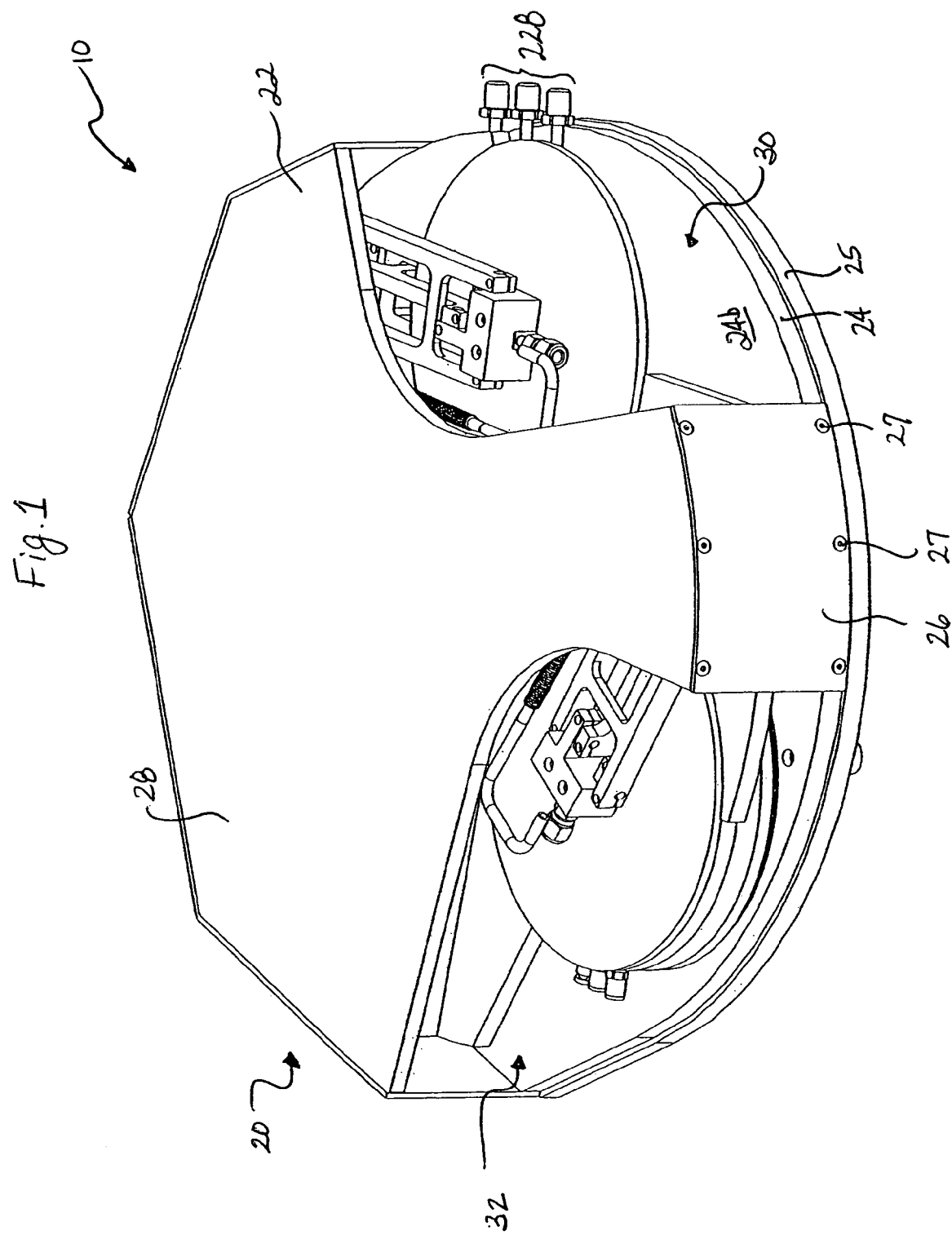
FIG. 1 is a perspective view of an apparatus for thermally processing microelectronic workpieces according to the present invention.

The present invention generally relates to an apparatus 10 and method for thermally processing microelectronic workpieces W. Referring to FIGS. 1 and 2, the apparatus or chamber 10 includes a housing 20, a carousel assembly 100 positioned within the housing 20, a driver and process fluid distribution system 200, a heating element 300 and a cooling element 400. As explained below, the chamber 10 has multiple stations for thermal processing of workpieces W. Although shown as a stand alone unit in FIG. 1, the chamber 10 can be positioned within a larger tool or module for high-speed processing of workpieces W.

The housing 20 of the chamber 10 generally comprises a cover 22 that is removeably connected to a base 24. The cover 22 has a side wall component 26 joined with a plurality of fasteners 27 to a top wall component 28. A portion of the base 24 has a stepped outer edge or lip 25 that facilitates the connection with the side wall 26 and that causes the periphery of the base 24 to have a staggered appearance. The cover 22 has at least one opening or bay 30 that provides access to the internal components of the chamber 10. Preferably, the cover 22 has both a first opening 30 that provides access for loading of the workpiece W and a second opening 32 that provides access for unloading of a processed workpiece W. Alternatively, the chamber 10 has a single opening whereby the workpieces W are loaded in and unloaded from that opening.

Figure 3A:
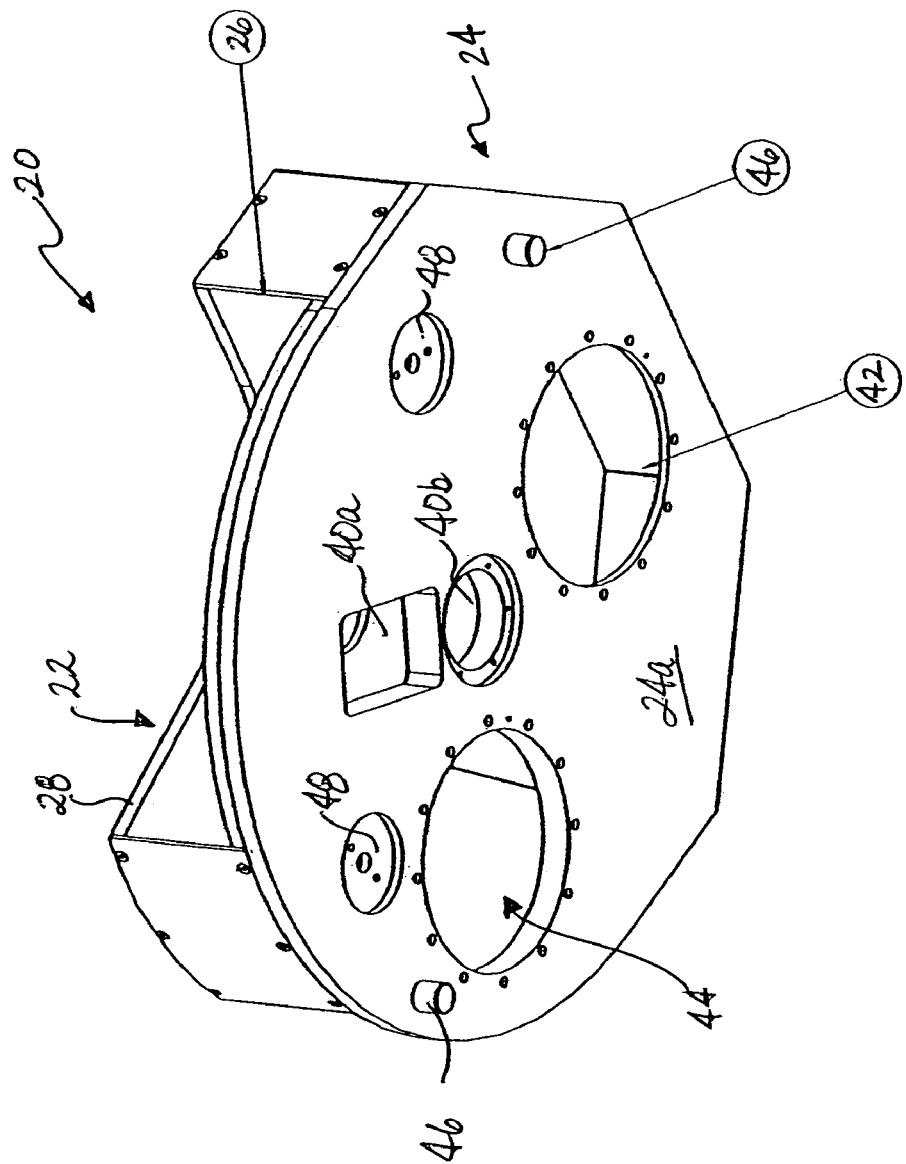
FIG. 3A is a perspective view of the apparatus of FIG. 1, showing the underside of the housing of the chamber.
Figure 3C:
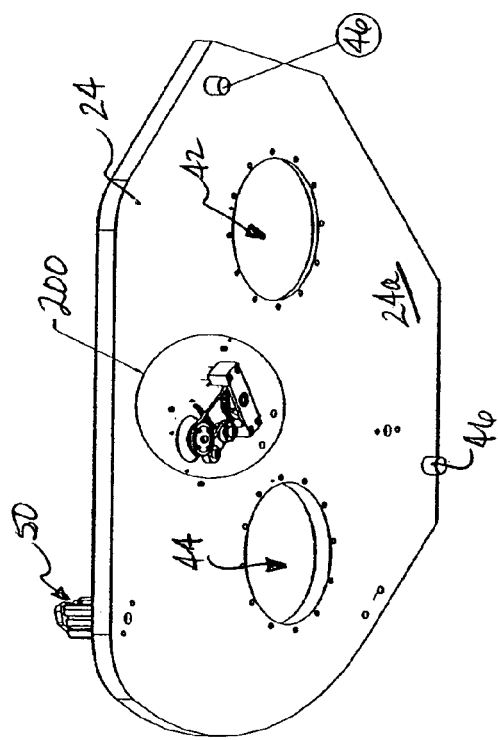
FIG. 3C is a perspective view of the apparatus of FIG. 1, showing the underside of the base of the housing.
Figure 3B:
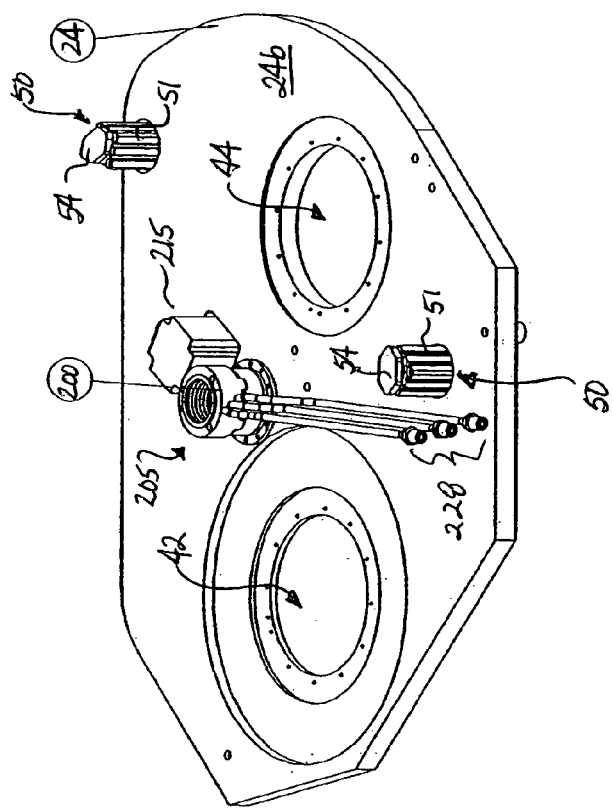
FIG. 3B is a perspective view of the apparatus of FIG. 1, showing a base of the housing of the chamber.

As shown in FIG. 3A, the base 24 of the housing 20 has a number of openings, including a pair of centralized openings 40a, b configured to receive an extent of the drive and process fluid distribution system 200. Specifically, the primary centralized opening 40a receives a portion of the drive components of the system 200 and the secondary centralized opening 40b receives a portion of the process fluid components of the system 200. The base 24 further includes a first opening 42 configured to receive a heating element 300 (see FIG. 10B), and a second opening 44 configured to receive a cooling element or chuck 400 (see FIG. 12B). At least one locating shaft 46 depends from a lower surface 24a of the base 24 to facilitate the installation of the chamber 10 into a larger tool or module. The locating shaft 46 is configured to receive a fastener inserted in an opening 47 in the upper surface of the 24b of the base 24. The base 24 may also include a pair of recessed areas 48 for securement of an actuator 50 that extends from a housing 51 substantially perpendicular to an upper surface 24b of the base 24. An alternate version of the base 24 is shown in FIGS. 3B and C, wherein the drive and process fluid distribution system 200 and two actuators 50 are installed in an alternate base 24. The alternate base 24 lacks the recessed areas 48 that are utilized in the securement of the actuators 50. Each actuator 50, such as an air cylinder, includes a shaft 52 with a pedestal 54 that is raised to engage an extent of a control arm 128 (see FIG. 2) of the cover assemblies 120, 122, 124 during operation of the apparatus 10. Preferably, the chamber 10 includes two air cylinders 50 since the cover assemblies 120, 122, 124 are elevated and the workpieces W are accessed and handled by a separate robot (not shown) at the loading station 505 and the cooling station 405. Alternatively, the chamber 10 includes a single air cylinder 50 whereby the workpieces W are access and handled at a single station 405, 505.

Figure 5A:
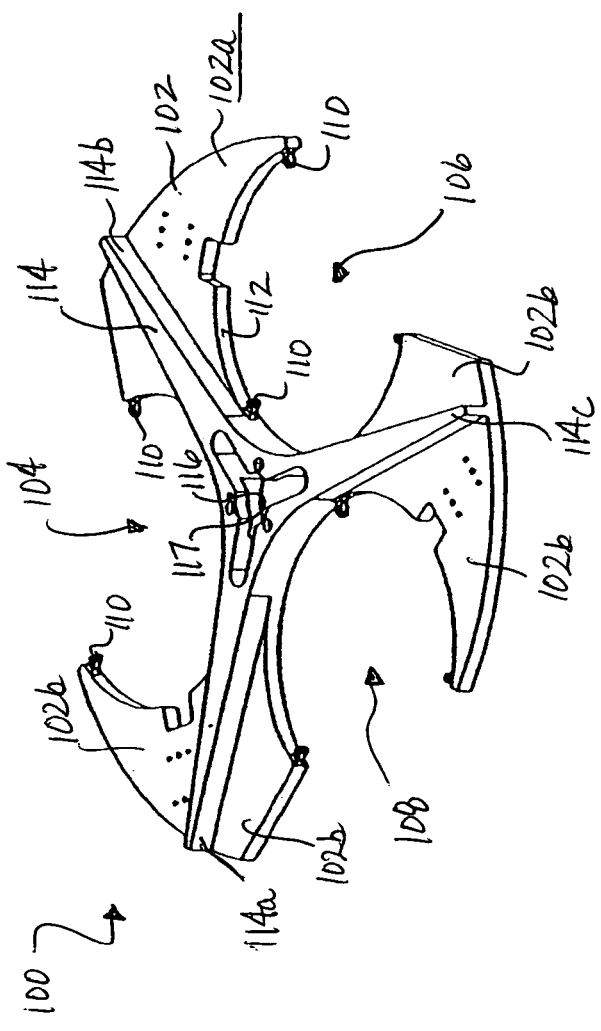
FIG. 5A is a perspective view a frame of the carousel assembly found in the apparatus of FIG. 1.

FIG. 2 shows the base 24 of the housing 20 and the carousel assembly 100, however, the cover 22 has been removed. The carousel assembly 100 rotates above the base 24 and about a central vertical axis extending through a centralized opening 40a of the base 24. Referring to FIGS. 2 and 5A,B, the carousel 100 includes a frame 102 that includes at least one workpiece receiver 104. In one embodiment, the frame 102 includes a first workpiece receiver 104, a second workpiece receiver 106, and a third workpiece receiver 108. The receivers 104, 106, 108 are configured to removeably receive a workpiece W during operation of the apparatus 10. The receivers 104, 106, 108 support the workpieces W in a substantially horizontal arrangement with respect to the frame 102. Preferably, each receiver 104, 106, 108 has a plurality of fingers or tabs 110 that extend radially inward from an inner edge 112 to support a workpiece W. In one embodiment, the tabs 110 are circumferentially spaced along the edge 112 of the receivers 104, 106, 108 and engage the lower (non-device) side of the workpiece W. Although shown as having a semi-circular configuration, additional material could be added to the receivers 104, 106, 108 whereby they would have a circular configuration.

Figure 5B:
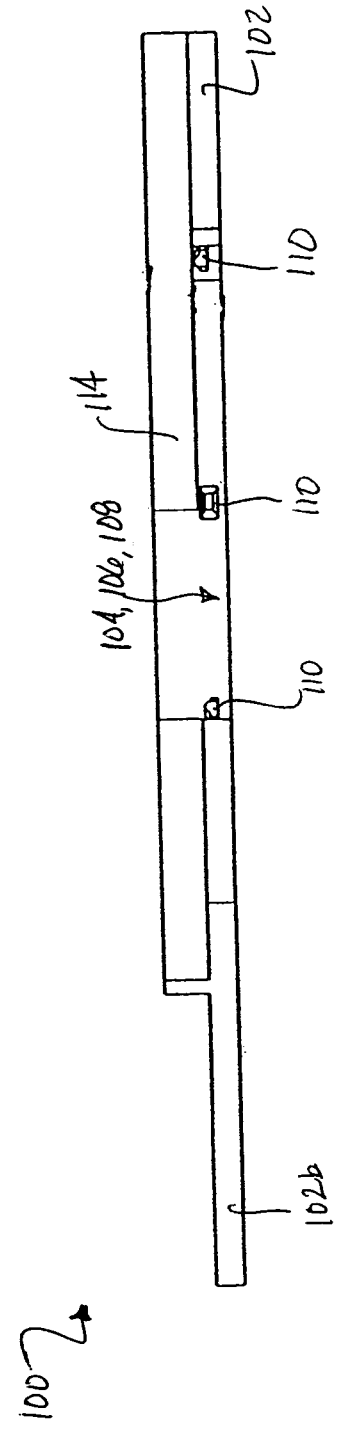
FIG. 5B is a side view a frame of the carousel assembly found in the apparatus of FIG. 1.

The frame 102 of the carousel 100 also includes a rib arrangement 114 that is raised vertically from an upper surface 102a of the frame 102. The frame 102 has external segments 102b and a depending segment 102c (see FIG. 5B). The rib arrangement 114 is generally configured to increase the rigidity and strength of the frame 102. The rib arrangement 114 has three segments 114a, b, c wherein each segment extends radially outward from a central opening 116 in the frame 102 and between a pair of receivers 104, 106, 108. The central opening 116 is positioned at the hub 117 of the frame 102 and accommodates an extent of the driver and process fluid distribution system 200, primarily a manifold 210 of the system 200. The receivers 104, 106, 108 are radially positioned about the central opening 116 in an approximately 120 degree relationship. When the carousel assembly 100 is assembled, the central opening 116 is cooperatively positioned with the centralized opening 40a of the base 24 and the central axis that extends there through.

Figure 4B:
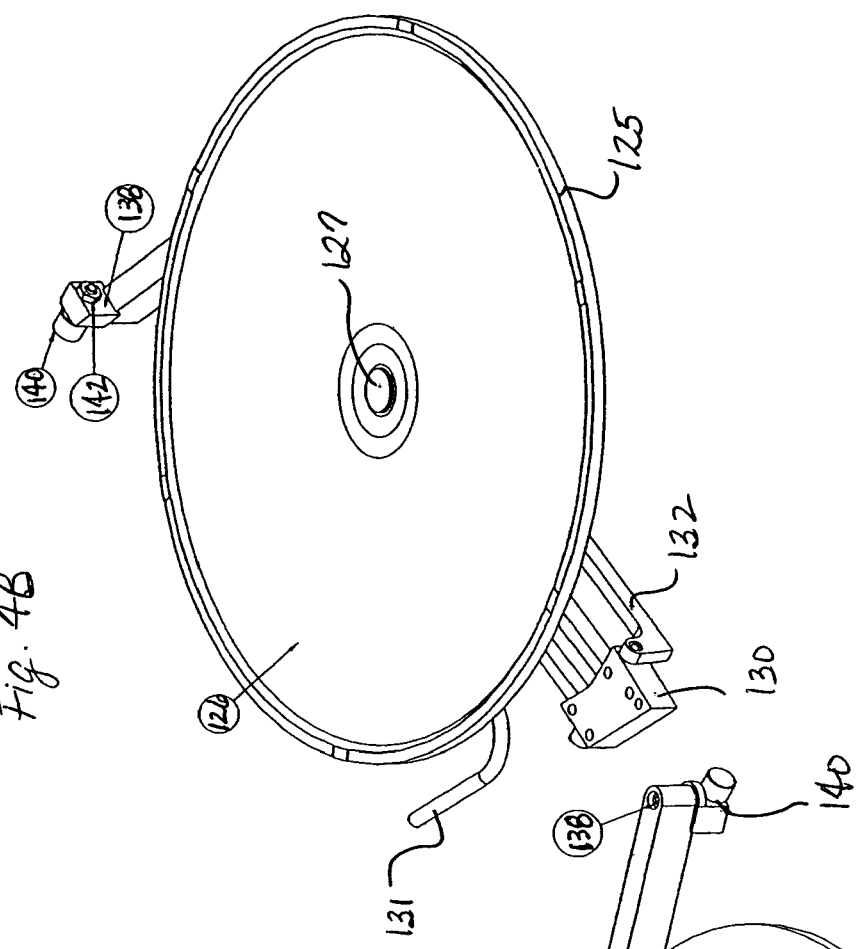
FIG. 4B is a perspective view of the cover assembly found in the apparatus of FIG. 1, showing an underside of the cover assembly.
Figure 4A:
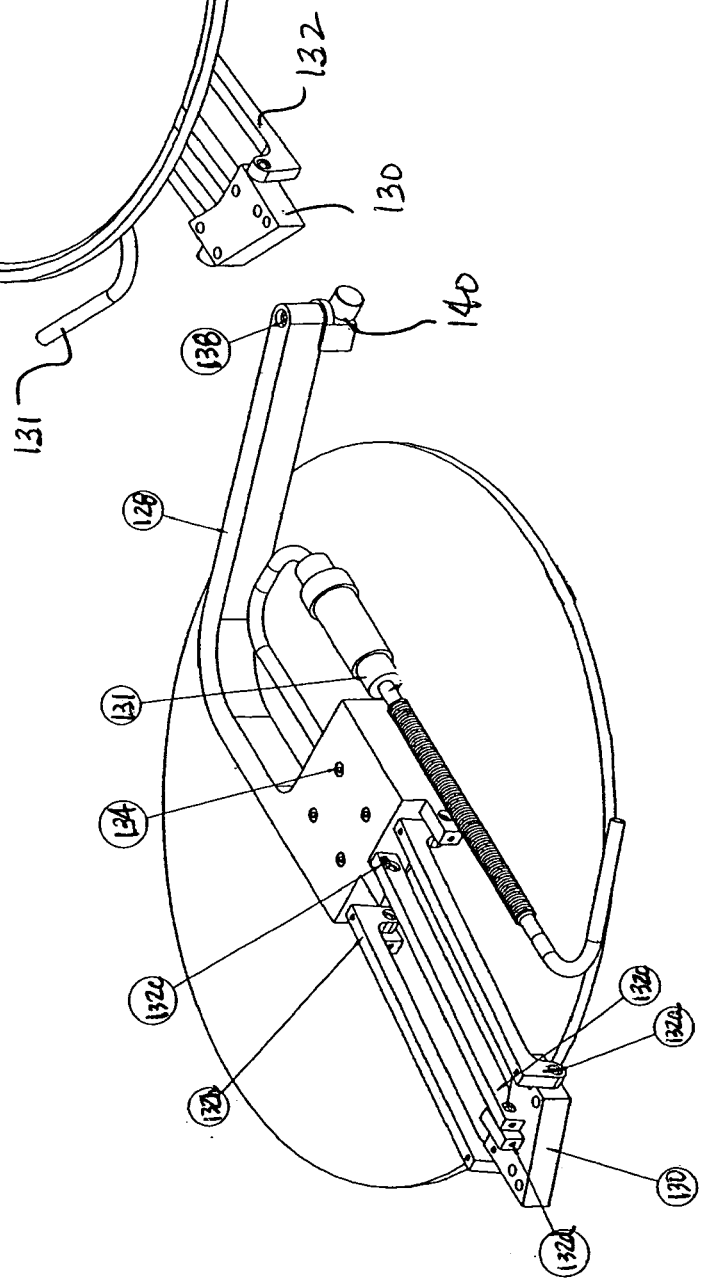
FIG. 4A is a perspective view of a cover assembly found in the apparatus of FIG. 1.

The carousel assembly 100 further includes at least one cover assembly 120 that is movable between a closed position $P_C$ (see FIG. 2) and an open position. Referring to FIG. 2, the carousel assembly 100 includes a first cover assembly 120 operably associated with the first workpiece receiver 104, a second cover assembly 122 operably associated with the second workpiece receiver 106, and a third cover assembly 124 operably associated with the third workpiece receiver 108. For example, the first cover assembly 120 remains positioned over the first receiver 104 and the second cover assembly 122 remains positioned over the second receiver 106 during rotation of the carousel assembly 100. Referring specifically to FIGS. 2 and 4A, B, each cover assembly 120, 122, 124 includes a cover plate 126, a control arm 128, a mounting bracket 130, and a purge line 131. The cover plate 126 is dimensioned to overlie or cover the receivers 104, 106, 108 when the cover assembly 120, 122, 124 is in the closed position $P_C$. In the closed position $P_C$ of FIG. 2, the cover plate 126 is positioned near external segments 102b of the frame 102. In an open position (not shown), the cover assembly 120, 122, 124 is elevated with respect to the frame 102 to permit insertion of a workpiece W into the receiver 104, 106, 108. Upon completion of the thermal processing steps, the cover assembly 120, 122, 124 is elevated in the open position to removal of a workpiece W from the receiver 104, 106, 108. The underside of the cover assembly 120, 122, 124 is shown in FIG. 4B, wherein the plate 126 has a circumferential lip 125 and a central opening 127 that, as explained below, receives process fluid during the thermal processing of the workpiece W. Therefore, in the closed position $P_C$, the cover assembly 120, 122, 124, the workpiece W and the frame 102 define an internal cavity that receives process fluid during operation of the chamber 10 to remove impurities from the cavity.

The control arm 128 pivotally connects the cover assembly 120, 122, 124 to an extent of the rib arrangement 114 with a mounting bracket 130, preferably near the terminus of the rib segments 114a, b, c. The control arm 128 is a multi-bar linkage system with a plurality of links 132 extending between the mounting bracket 130 and a distribution block 134. The control arm 128 has a pair of external links 132a, b pivotally connected to outer walls of the bracket 130 and an internal link 132c connected to a short link 132d that is affixed to an intermediate portion of the bracket 130. The distribution block 134 is affixed to an upper surface 126a of the cover plate 126 and is in fluid communication with the central opening 127. The control arm 128 also has a curvilinear segment 136 that extends from the block 134 beyond the periphery of the cover plate 126. A terminal end 138 of the curvilinear segment 136 has a fitting 140 secured by a nut 142 wherein the fitting 140 is adapted to engage the air cylinder 50, preferably the pedestal 54, to move the cover assembly 120, 122, 124 to the open position $P_O$.

A fluid or purge line 131 of the cover assembly 120, 122, 124 extends between the distribution block 134 and the manifold 210 of the driver and process fluid distribution system 200. The driver and process fluid distribution system 200 is affixed to the carousel 100 at the rib arrangement 114 by at least one fastener 115. As explained below, the manifold 210 is in fluid communication with the driver and process fluid distribution system 200. The manifold 210 includes three outlet or discharge ports 212 that are connected to a first end 131a of the purge line 131. A second end 131b of the fluid line 131 is in fluid communication with the distribution block 134. In general terms, process fluid is delivered from the manifold 210, through the fluid lines 131 and to the blocks 134 for further distribution into the opening 127 of the cover plate 126 and then to the workpiece W supported by the receivers 104, 106, 108.

As briefly explained above, the base 24 of the housing 20 has a number of openings 40a, b configured to receive the driver and process fluid distribution system 200. Referring to FIGS. 3A–C, 6A–D and 7, the driver and process fluid distribution system 200 features a process fluid distribution assembly 205 and a driver assembly 215, wherein the assemblies 205, 215 are connected to a mounting plate 220, which in turn is connected to the base 24. Alternatively, the mounting plate 220 is omitted and the assemblies 205, 215 are fastened directly to the base 24 of the housing 20. In one embodiment, the process fluid distribution assembly 205 and the driver assembly 215 are integrated units. In another embodiment, the process fluid distribution assembly 205 is distinct and separate from the driver assembly 215. The process fluid assembly 205 is designed to supply process fluid to workpieces W at the loading, heating, and/or cooling stations 505 305, 405. The process fluid distributed by the system 200 can purge the loading, heating, and cooling stations 505, 305, 405 of oxygen or impurities. Also, the process fluid distributed by the system 200 can aid with the thermal processing of the workpiece W in the loading, heating, and cooling stations 505, 305, 405. The process fluid can be an inert gas such as argon or helium, a non-oxidizing gas such as nitrogen, a reducing gas such as hydrogen, an oxidizing gas such as oxygen or ozone, or any combination thereof. Preferably, the process fluid comprises approximately 90–97% by volume argon and approximately 3–0% by volume hydrogen, or approximately 90–98% by volume nitrogen and approximately 2–10% by volume hydrogen. Furthermore, the process fluid can be any fluid that aids with the removal of impurities and/or aids with the thermal processing of workpieces W. The driver assembly 215, through an indexing drive motor 234, precisely rotates the carousel assembly 100 above the base 24 and between thermal processing stations.

Once installed in the base 24, an extent of the driver and process fluid distribution system 200 is positioned above the base 24 and a remaining extent of the system 200 is positioned below the base 24. A bracket 217 is connected to the lower surface 220a of the mounting plate 220 with fasteners 217a and at least one pin dowel 217b (see FIG. 7). The bracket 217 is adapted to provide support to components of the process fluid assembly 205 during operation of the carousel assembly 100. A cover 219 is removeably connected to the mounting plate 220 by at least one fastener 221 to enclose the lower components of the driver and process fluid distribution system 200, meaning those components positioned below the base 24.

As shown in FIGS. 6A–D and 7, the process fluid distribution assembly 205 generally includes the manifold 210 with outlet ports 212 that are in fluid communication with the purge lines 131, a base 222 with a flange 224 for connection to the mounting plate 220, and a generally cylindrical input sleeve 226 that receives process fluid from the supply lines 228. In the embodiment shown in FIGS. 3A–C and 7, the manifold 210 and the mounting plate 220 are omitted, however, the flange 224 of the base 222 is directly connected to a recessed mounting region of the centralized opening 40b. While the base 222 and the input sleeve 226 are stationary components of the process fluid assembly 205, the manifold 210 rotates about a substantially vertical axis defined by a shaft 236 during operation of the carousel assembly 100. The manifold 210 has a shoulder 211 that overlies an upper region of the sleeve 226 after the manifold 210 is installed (see FIG. 6D). Furthermore, the manifold has a depending segment 210a that extends into the sleeve 226.

Figure 8:
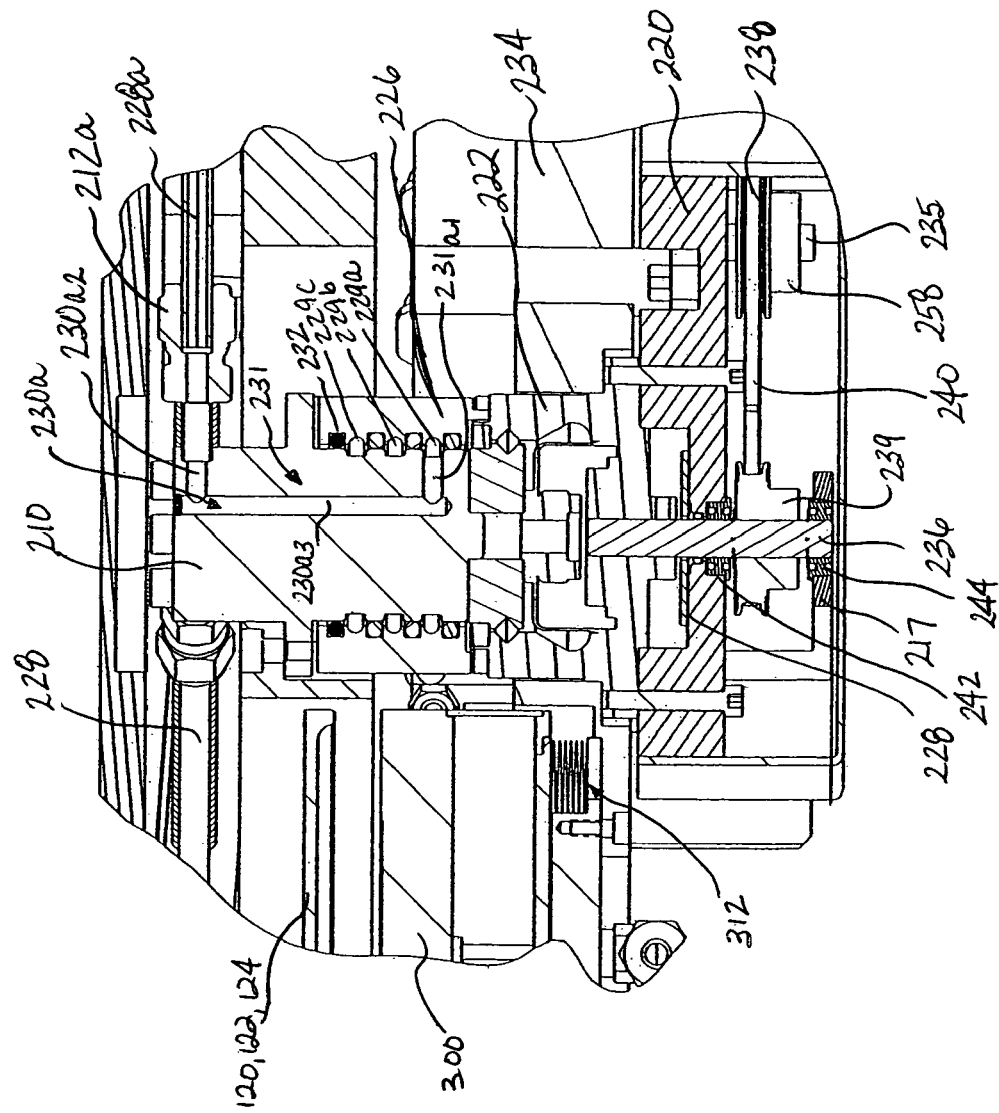
FIG. 8 is a partial cross-section of the driver and process fluid distribution system found in the annealing chamber of FIG. 1, showing internal components, including a passageway, of the system.

As shown in FIGS. 6B and 7, a plurality of supply lines 228 are connected to the input sleeve 226, wherein the lines 228 provide a quantity of process fluid, primarily a non-oxidizing gas, to the sleeve 226 and the manifold 210 for distribution through the fluid lines 131 to the cover plates 126. The supply lines 228a, b, c are removeably connected to the inlet opening 227a, b, c of the sleeve 226 (see FIG. 6A). The sleeve 226 has a plurality of internal annular or ring-shaped channels 229a, b, c wherein each channel 229 is in fluid communication with an inlet opening 227a, b, c. Preferably, the channels 229a, b, c are flush with an inner wall of the sleeve 226. Referring to FIG. 8, the rotatable manifold 210 has a plurality of internal channels 230a, b, c that extend between upper and lower segments of the manifold 210 and that are in fluid communication with the annular channels 229a, b, c of the sleeve 226. Preferably, the channels 230a, b, c in the manifold 210 include two horizontal runs—a lower run $230_1$ and an upper run $230_2$ and a vertical run $230_3$—to ensure fluid communication with the annular channels 229a, b, c and the discharge ports 212a, b, c. For example and as shown in FIG. 8, the lower run $230a_1$ of the channel 230a is in fluid communication with the annular channel 229a, and the upper run $230a_2$ is in fluid communication with the discharge port 212a. The annular channels 229 in the sleeve 226 and the internal channels 230 of the manifold 210 define an air or fluid passageway 231a, b, c for the flow of process fluid delivered by the supply lines 228a, b, c to the inlet openings 227a, b, c. Accordingly, each passageway 231a, b, c extends from the inlet opening 227a, b, c through the annular channel 229a, b, c, then the internal channel 230a, b, c and to discharge port 212a, b, c. The passageways 231a, b, c enable the process fluid distribution system 205 to delivery process fluid to the workpiece W while it is supported by any of the receivers 104, 106, 108 at the loading station 505 (see FIG. 13) or as the carousel assembly 100 is rotated from the station 505 to the heating station 405. In another embodiment, the passageways 231a, b, c enable the process fluid distribution system 205 to delivery process fluid to the workpiece W while it is supported by any of the receivers 104, 106, 108 at each of the loading, heating and cooling stations 505, 305, 405.

The process fluid assembly 205 further includes means for sealing the process fluid supplied to the sleeve 226. The sealing means comprises a plurality of gaskets or sealing rings 232, for example, O-rings, positioned about the channels 230 in the sleeve 226 (see FIGS. 6C, 7 and 8). In one embodiment, the process fluid assembly 205 includes three fluid passageways 231a, b, c wherein each passageway 231a, b, c is in fluid communication with a single, distinct discharge port 212a, b, c. This configuration ensures that a precise amount and/or type of process fluid will be delivered by the passageway 231a, b, c to each discharge port 212a, b, c for further distribution to specific components of the carousel assembly 100. As a result, the components of the carousel assembly 100 downstream of the passageway 231a, b, c can be selectively supplied with process fluid for the workpiece W. In another embodiment, the process fluid assembly 205 includes a single passageway 231 through the sleeve 226 and manifold 210 to deliver process fluid to all of the discharge ports 212a, b, c.

One of skill in the art recognizes that the formation of a passageway 231a, b, c is not dependent upon the angular position of the manifold 210 with respect to the sleeve 226, since the annular channel 229a, b, c has a continuous, uninterrupted configuration. In another version of the process fluid assembly 205, the channel 229a, b, c has a short, non-annular configuration. Accordingly, a passageway 231a, b, c for process fluid will be only formed when the internal channel 230a, b, c, primarily the lower run $230_1$, is aligned or cooperatively positioned with the channel 229a, b, c. In yet another version, the channel 229a, b, c has a discontinuous or segmented configuration whereby the passageway 231a, b, c will only be formed when the lower run $230_1$ is cooperatively positioned with the channel 229a, b, c.

As explained in greater detail below, the driver assembly 215 rotates the carousel assembly 100, including three cover assemblies 120, 122, 124, the control arms 128, and the frame 102, between the loading, heating and cooling stations 505, 305, 405. Alternatively, the loading station 505 is omitted and the driver assembly 215 rotates the carousel assembly 100 between the heating and cooling stations 405, 505. The driver assembly 215 includes an indexing drive motor or driver 234 with a depending shaft 235, the longer shaft 236 extending through an opening in the mounting plate 220, a first pulley 238, a second pulley 239, and a timing belt 240. In general terms, the pulleys 238, 239, the belt 240 and the shaft 236 are operably connected to the indexing motor 234 to drive the manifold 210. The drive mechanism 234 further includes a first bearing 242 positioned within a recess of the mounting plate 220, a second bearing 244 positioned in a recess of the bracket 217, and a pair of ring seals 246 located at opposed ends of the shaft 236. As shown in FIG. 6A, the second bearing 244 has an open face whereby the end wall 236a of the shaft 236 is visible. A plate seal 248 is affixed to an upper wall in a recess 250 of the mounting plate 220 by fasteners 252 and a smaller seal 254 is positioned between the first bearing 242 and the plate seal 248.

As shown in FIGS. 6A and 7, to aid with the operable connection between the pulleys 238, 239 and the timing belt 240, the driver assembly 215 features a tensioner assembly which includes a tensioning arm 256 and a bearing 258 that engages the timing belt 240 during its operation. The tensioner assembly also includes a first fastener 260 that pivotally connects the arm 256 to the lower surface 220a of the mounting plate 220, and a second fastener 262 and washer 264 that rotatably secures the bearing 258 to the arm 256. The tensioner assembly further includes a coil spring 266 for biasing the tensioning arm 256 towards the timing belt 240 whereby the bearing 258 rotatably engages the belt 240. The coil spring 266 is secured at its first end to a retainer 268 affixed to the tensioning arm 256 and at its second end by a pin 270 affixed to the mounting block plate 220.

The driver assembly 215 and the process fluid assembly 205 feature a compact design, which permits a significant portion of the driver and process fluid distribution system 200 to be packaged between the base 24 of the housing 20 and the frame 102 of the carousel assembly 100. Due to the indexing drive motor 234, the driver assembly 215 precisely drives or rotates the manifold 210 and the carousel assembly 100, including the cover assemblies 120, 122, 124, and the frame 102, above the base 24 and between the radially positioned stations 305, 405, 505 for thermal processing of the workpieces W. The remaining components of the process fluid distribution system, including the base 222 and the sleeve 226, are not rotated and remain stationary with respect to the base 24.

Referring to FIGS. 9A–D and 10A, B, the chamber 10 includes an electrically-powered heating element or chuck 300 that transfers a sufficient quantity of heat to the workpiece W during thermal processing. In one embodiment, the workpiece W is rotated by the carousel assembly 100 from a loading position P0 at the loading station 505 (see FIG. 13) to a heating station 305. The heating station 305 is a region of the chamber 10 that is defined by the heating element 300, a portion of the carousel assembly 100 (primarily the extent of the plate 102 positioned above the heater element 300, including the tabs 110 that support the workpiece W), and the cover plate 126 of the a cover assembly 120, 122, 124. Described in a different manner, the driver assembly 215 rotates the workpiece W supported in the carousel assembly 100 from the loading position P0 to a first position P1 (see FIG. 10B) for thermal processing, wherein in the first position P1 the workpiece W is positioned directly above the heating element 300. Through rotation of the carousel assembly 100, the workpieces W can be sequentially placed in the first position P1. In another embodiment, the loading station 505 and the heating station 305 are combined whereby the loading position P0 and the first position P1 are consolidated causing the workpiece W to be loaded and heated by the heating element 300 in the same general location.

The heating element 300 has a generally cylindrical configuration and as shown in FIGS. 10A and B, is positioned within the opening 42 in the base 24 of the housing 20 to define an initial position. Furthermore, the heating element 300 is positioned substantially between the base 24 and the frame 102 of the carousel assembly 100, while being positioned radially outward of the driver and process fluid distribution system 200. The heating element 300 generally comprises an upper portion 302 with a heating surface 304 that is placed in thermal contact with the workpiece W, an intermediate portion 306 with a insulated cavity 308, and a lower portion 310 that includes an actuator 312, such as a bellows assembly, that moves or elevates the heating element 300 from the initial position to a use position for thermal processing of the workpiece W. Upon completion of the thermal processing of a particular workpiece W, the actuator 312 returns the heating element 300 to its initial position.

The upper portion 302 employs an electrically-powered resistive heater 303 and has a circular periphery 314. A recessed annular ledge 316 is positioned radially inward of the periphery 314. In one embodiment the heating surface 304 is located radially inward of the ledge 316, while in another embodiment, the heating surface 304 extends to the periphery 314 of the upper portion 302. The heating surface 304 is cooperatively dimensioned with the workpiece W to permit thermal processing of the workpiece W. The heating surface 304 includes an arrangement of vacuum channels 318 that are positioned about a central opening 320 of the heating surface 304. A passageway 322 extends transverse to the heating surface 304 from the central opening 320 to an internal fitting 324. Vacuum air is supplied through the fitting 324 and the passageway 322 to the vacuum channels 318 wherein the vacuum air helps to maintain a vacuum seal engagement between the heating element 300 and the workpiece W. A vacuum air delivery mechanism, including an external fitting 326, extends through the intermediate and lower portions 306, 310 and is in fluid communication with the internal fitting 324. The vacuum air delivery mechanism is coupled to a vacuum source (not shown) that supplies the vacuum air used during annealing of the workpiece W.

Preferably, the upper portion 302 also includes a plurality of depressions 328 that extend radially inward from the periphery 314. The depressions 328 are cooperatively positioned and dimensioned to receive an extent of the tabs 110 of the frame 102 of the carousel assembly 100 when the heating element 300 is elevated by the bellows assembly 312 to the use position and the heating surface 304 engages the workpiece W. The depressions 328 disengage the tabs 110 when the thermal processing is completed and the bellows assembly 312 lowers the heating element 300 to its initial position. Alternatively, the depressions 328 are omitted and tabs 110 engage a portion of the heating surface 304 when the heating element 300 is elevated. To secure the upper portion 302 to the heating element 300, a plurality of fasteners 330 are inserted through slots 332 in the side wall 334 of the upper portion 302.

The intermediate portion 306 of the heating element 300 includes a cavity 308 within a side wall 307 wherein the cavity 308 includes conventional insulation. The intermediate portion 306 also includes a bottom wall 336 that is secured to a top wall 338 of the lower portion 310 by fasteners 340 (See FIG. 9D).

The actuator or bellows assembly 312 is generally positioned in the lower portion 310 of the heater element 300. The bellows assembly 312 moves the upper and intermediate portions 302, 306, including the heating surface 304, from the initial position towards the frame 102 of the carousel assembly 100 and to the use position. In the initial position and as shown in FIG. 10B, there is a clearance C between the heating surface 304 and the workpiece W. In the use position, the heating element 300 is in thermal engagement with the workpiece W to enable heat transfer to the workpiece W. Preferably, in the use position, the heating surface 304 is in direct contact with the non-device side of the workpiece W thereby eliminating the clearance C. Alternatively, in the use position, the heating surface 304 is in close proximity to the non-device side of the workpiece W thereby significantly reducing the clearance C. When the bellows assembly 312 lowers the heating element 300 from the use position to the initial position, the clearance C is present.

The bellows assembly 312 includes the top wall 338, a bottom wall 344, and a bellow 346. In one embodiment, the bellow 346 has a cylindrical configuration and the bottom wall has a central core 345 that is positioned within the bellow 346. In another embodiment, the bellows assembly 312 includes a number of bellows 346 circumferentially spaced with respect to the bottom wall 336. Referring to FIG. 10B, at least one fastener 345 extends through the bottom wall 344 and the base 24 to secure the heating element 300 to the chamber 10 above the opening 42 in the base 24. The bellows assembly 312 further includes a bushing 348 within a cover 350 affixed to the bottom wall 344 by fasteners 352. A sealing ring 354, preferably an O-ring, configured to seal the cover 350 with respect to the bottom wall 344 is positioned within a cavity of the cover 350. The bushing 348 is affixed to the bottom wall 344 by fasteners 356, and has a central opening with a guide sleeve 358 that sliding engages an extent of a guide shaft 360. A stop portion 360a extends transversely to a main body potion 360b of the shaft 360. The shaft 360 is coupled to the top wall 338 at an upper portion 360c by fasteners 362. In operation of the bellow assembly 312 and while the heating element 300 is moved between the initial and use positions, the guide shaft 360 slides through the sleeve 358 and towards the heating surface 304.

Figure 9B:
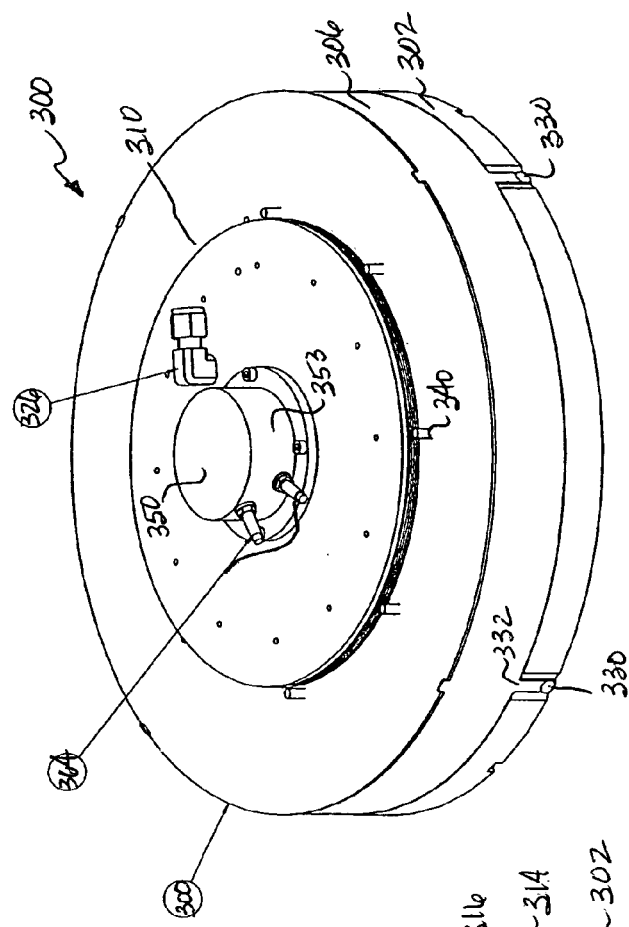
FIG. 9B is a perspective view of the heating element of FIG. 9A, showing an underside of the cooling element.
Figure 9A:
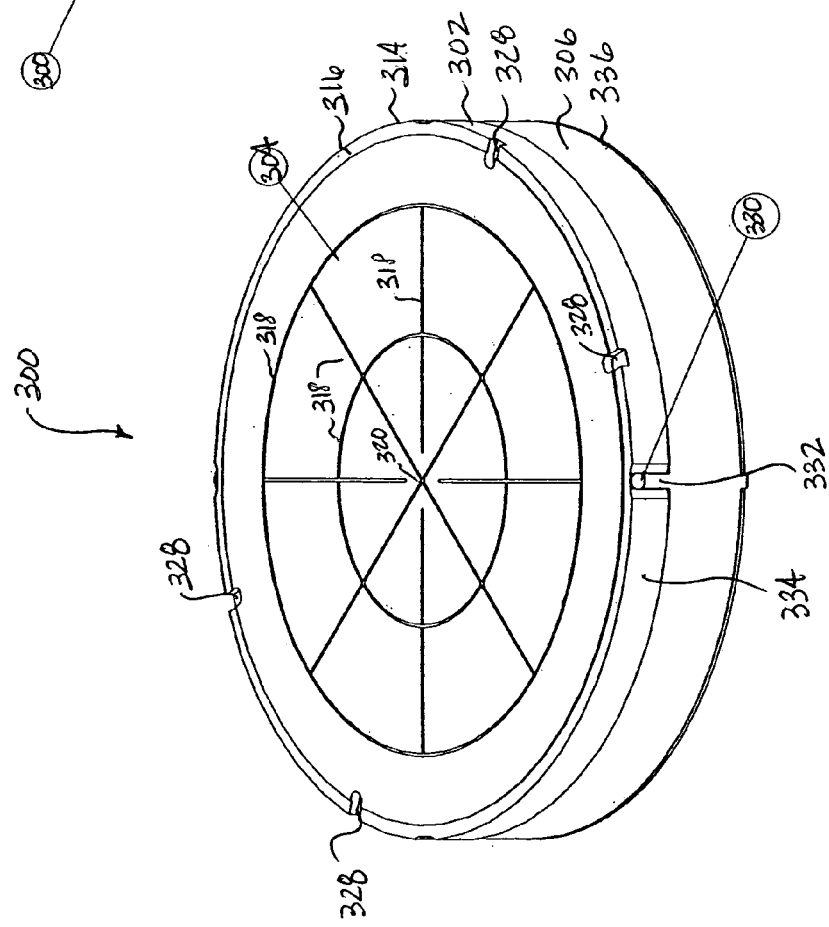
FIG. 9A is a perspective view of a heating element of the apparatus of FIG. 1.
Figures 9C, 9D:
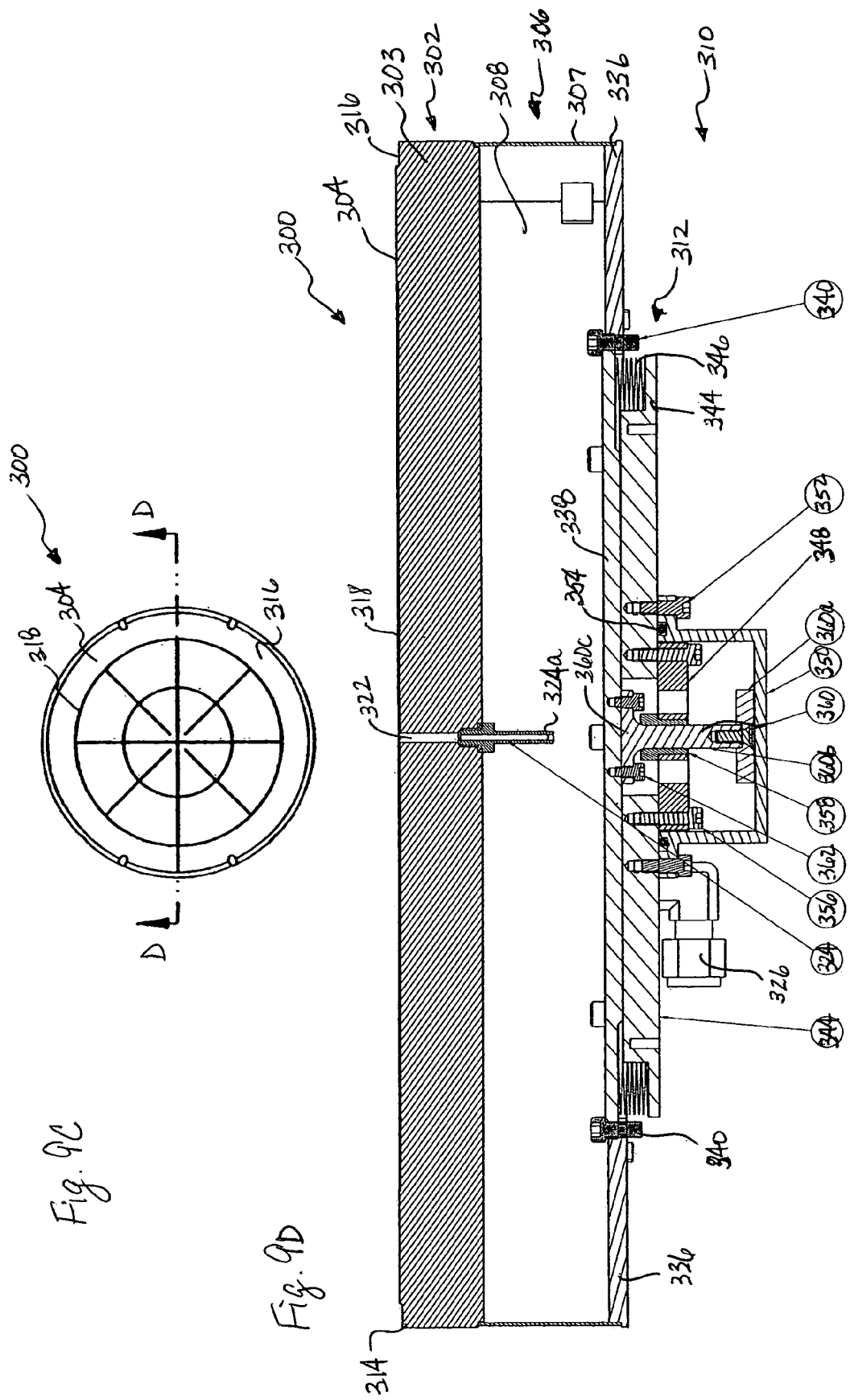
FIG. 9C is a plan view of the heating element of FIG. 9A.
FIG. 9D is a cross-section of the heating element of FIG. 9A taken along line D—D of FIG. 9C.

When the bellow assembly 312 moves the upper and intermediate portions 302, 304 a sufficient distance to bring the heating element 300 to the use position, vacuum air is supplied to the internal fitting 324 for delivery through the central opening 320 in the heating surface 304. Similarly, when the heating element 300 reaches the use position, the heating element 300 is activated to begin a heating cycle for the annealing of the workpiece W. Referring to FIG. 9B, the bellows assembly 312 includes at least one inductive sensor 364 which extends though a side wall 353 of the cover 350 and that monitors the position of the heater element 300, including the shaft 360. The sensor 364, in connection with the control system 600, prevents rotation of the carousel assembly 100 until the bellows assembly 312 returns the heating element 300 to its initial position (see FIG. 10B). In operation, the sensor 364 and the control system ensure the timely rotation of the carousel assembly 100, the delivery of vacuum air, and the activation of the heating element 300 and the heating cycle.

Referring to FIGS. 11A–D and 12A, B, the chamber 10 includes a cooling element or chuck 400 that cools the workpiece W during a post-heating stage of thermal processing. After the heating stage is completed, the workpiece W is rotated by the carousel assembly 100 from the heating station 305 to a cooling station 405 having the cooling element 400. The cooling station 405 is a region of the chamber 10 that is defined by the cooling element 400, a portion of the carousel assembly 100 (primarily the extent of the plate 102 positioned above the cooling element 400, including the tabs 110 that support the workpiece W), and the cover plate 126 of a cover assembly 120, 122, 124. Described in a different manner, the driver assembly 215 rotates the workpiece W supported in the carousel assembly 100 from the first position P1 to a second position P2 (see FIG. 12B) for thermal processing. In the second position P2 the workpiece W is positioned substantially above the cooling element 400. Through rotation of the carousel assembly 100, the workpieces W are sequentially placed in the second position P2 for thermal processing by the cooling element 400. As shown in FIG. 12B, the workpiece W is supported in the second position P2 by the tabs 110 of the frame 102. Preferably, the workpiece W is removed or unloaded from the carousel assembly 100 at the second position P2 through the second opening 32 upon completion of the cooling cycle. Alternatively, the workpiece W is rotated from the cooling station 405 to the loading station 505 or the loading position P0 where it is unloaded prior to the loading of an unprocessed workpiece W.

The cooling element 400 has a generally cylindrical configuration and as shown in FIGS. 12A and B, is positioned within the opening 44 in the base 24 of the housing 20. Furthermore, the cooling element 400 is positioned substantially between the base 24 and the frame 102 of the carousel assembly 100. Like the heating element 300, the cooling element 400 is positioned radially outward of the driver and process fluid distribution system 200. The cooling element 400 generally comprises an upper portion 402 with a cooling surface 404 that is placed in thermal contact with the workpiece W, an intermediate portion 406, and a lower portion 410 that includes an actuator 412, such as a bellows assembly, that moves the cooling element 400 for thermal processing of the workpiece W.

The upper portion 402 has a circular periphery 414 and a recessed annular ledge 416 positioned radially inward of the periphery 414. In one embodiment the cooling surface 404 is located radially inward of the ledge 416, while in another embodiment, the cooling surface 404 extends to the periphery 414 of the upper portion 402. The cooling surface 404 includes an arrangement of vacuum channels 418 that are positioned about a central opening 420 of the cooling surface 404. A passageway (not shown) extends transverse to the cooling surface 404 from the central opening 420 to an internal fitting (not shown). Vacuum air is supplied through the fitting and the passageway to the vacuum channels 418 wherein the vacuum air helps to maintain a vacuum seal engagement between the cooling element 400 and the workpiece W. A vacuum air delivery mechanism, including an external fitting 426, extends through the intermediate and lower portions 406, 410 and is in fluid communication with the vacuum channels 418. The vacuum air delivery mechanism is coupled to a vacuum source (not shown) that supplies the vacuum air used during annealing of the workpiece W.

Preferably, the upper portion 402 also includes a plurality of depressions 428 that extend radially inward from the periphery 414. The depressions 428 are cooperatively positioned and dimensioned to receive an extent of the tabs 110 of the frame 102 of the carousel assembly 100 when the cooling element 400 is elevated by the bellows apparatus 412 to the use position and the cooling surface 404 thermally engages the workpiece W. The depressions 428 disengage the tabs 110 when the thermal processing is completed and the bellows apparatus 412 lowers the cooling element 400 to its original position. Alternatively, the depressions 428 are omitted and the workpiece W engages an extent of the cooling surface 404 when the cooling element 400 is elevated by the bellows apparatus 412.

The upper portion 402 of the cooling element 400 further includes a cooling system 430 that comprises a plurality of internal channels 432, at least one inlet port 434 and at least one outlet port 436. The internal channels 432, the inlet port 434 and outlet port 436 define a fluid passageway for the cooling medium utilize during operation of the cooling station 405. The cooling medium used in the cooling system 430 and supplied to the channels 432 is a fluid such as water, glycol or a combination thereof. In operation, the cooling medium is supplied through the inlet ports 434 to the channels 432 and discharged by the outlet port 436. Although shown in FIG. 11D as being positioned on one side of the upper portion 402, the channels 432 are arrayed throughout the upper portion 402. Thus, there is an innermost annular channel 432a, an outermost annular channel 432b, and at least one intermediate annular channel 432c. The precise number of channels 432 varies with the design parameters of the cooling element 400 and the cooling system 430. An inner sealing ring 431 is positioned radially inward of the inner-most channel 432a and about a fastener 433 that secures the upper portion 402 to the intermediate portion 406, and an outer sealing ring 435 is positioned radially outward of the outer-most channel 432b. Preferably, the sealing rings 431, 433 are O-rings.

In one embodiment, the cooling system 430 includes an inlet manifold (not shown) that distributes the cooling media from the inlet ports 434 to the internal channels 432. Similarly, the cooling system 430 includes a discharge manifold (not shown) that distributes cooling medium from the channels 432 to the discharge port 436. In another embodiment, the inlet and outlet manifolds are omitted wherein the internal channels 432 are in fluid communication with each other to define a single, continuous fluid passageway from the inlet port 434, through the internal channels 432 and to the outlet port 436. In yet another embodiment, the internal channels 432 are annular channels arrayed in a concentric manner and are in fluid communication with inlet and discharge manifolds.

The intermediate portion 406 of the cooler element 300 is secured to the upper portion 402 by the fastener 426. Although shown as having a solid, plate-like configuration, the intermediate portion 406 can include an insulated cavity. The intermediate portion 406 is secured to a top wall 438 of the lower portion 410 by fasteners 440 (See FIG. 11D).

The actuator or bellows assembly 412 is generally positioned in the lower portion 410 of the cooling element 400. The bellows assembly 412 moves the upper and intermediate portions 402, 404, including the cooling surface 404, from the initial position towards the frame 102 of the carousel assembly 100 and to the use position. In the initial position and as shown in FIG. 12B, there is a clearance C between the cooling surface 404 and the workpiece W. In the use position, the cooling element 400 is in thermal engagement with the workpiece W to enable heat transfer to the workpiece W. Preferably, in the use position, the cooling surface 404 is in direct contact with the non-device side of the workpiece W thereby eliminating the clearance C. Alternatively, in the use position, the cooling surface 404 is in close proximity to the non-device side of the workpiece W thereby significantly reducing the clearance C. When the bellows assembly 412 lowers the cooling element 400 from the use position to the initial position, the clearance C is present.

The bellows assembly 412 includes the top wall 438, a bottom wall 444, and a bellow 446. In one embodiment, the bellow 446 has a cylindrical configuration and the bottom wall 444 has a central core 448 that is positioned within the bellow 446. In another embodiment, the bellows assembly 412 includes a number of bellows 446 circumferentially spaced with respect to the bottom wall 436. Referring to FIG. 12B, at least one fastener 445 extends through the bottom wall 444 and the base 24 to secure the cooling element 400 to the chamber 10 above the opening 44 in the base 24.

As shown in FIGS. 11B and D, a mounting ring 449 depends from the bottom wall 444. A cover 450 of the bellows assembly 412 is positioned within the central region of the ring 449, wherein the cover 450 affixed to the bottom wall 444 by fasteners 451. A bushing 452 is positioned within the cover 450 and is affixed to the bottom wall 444 by at least one fastener 454. A sealing ring 456, preferably an O-ring, is positioned within a cavity of the cover 450. The bushing 452 has a central opening with a guide sleeve 458 that sliding engages an extent of a guide shaft 460. A stop portion 460a extends transversely to a main body potion 460b of the shaft 460. The shaft 460 is coupled to the top wall 438 at an upper portion 460c by at least one fastener 462.

In operation of the bellow assembly 412, the guide shaft 460 slides through the sleeve 458 and towards the cooling surface 404. When the bellow assembly 412 moves the cooling element 400 to the use position, vacuum air is supplied for delivery through the central opening 420 in the cooling surface 404. Similarly, when the cooling element 400 is raised to the use position, the cooling system 430 is activated to begin a cooling cycle for the workpiece W. Referring to FIGS. 11B and D, the bellows assembly 412 includes at least one inductive sensor 464 that extends through a side wall 453 of the cover 450 and that monitors the position of the cooling element 400, including the shaft 460. The sensor 464, in connection with the control system 600, prevents rotation of the carousel assembly 100 until the bellows assembly 412 returns the cooling element 400 to its initial position, as shown in FIG. 12B. In operation, the sensor 464 and the control system ensure the timely rotation of the carousel assembly 100, the delivery of vacuum air, and the activation of the cooling mechanism and the cooling cycle.

Referring to FIGS. 13A, B, the chamber 10 includes a loading station 505 where the workpiece W is inserted into the carousel assembly 100 to begin the thermal processing. The loading station 505 is a region of the chamber 10 that is defined by a portion of the carousel assembly 100, primarily the inner portion of the plate 102 including the tabs 110 that support the workpiece W, and the cover plate 126 of a cover assembly 120, 122, 124. Preferably, the workpiece W is placed in the loading station 505 through the first opening 30. Since the loading station 505 lacks a heating element 300 or a cooling element 400, the supply lines 229a–c are positioned near the loading station 505. In another embodiment, the loading station 505 is omitted from the chamber 10 whereby the workpieces W are loaded directly into the heating station 305.

The loading, heating and cooling stations 505, 305, 405 are positioned radially outward of the driver and process fluid distribution system 200. Although the loading, heating and cooling stations 505, 305, 405 are shown to be positioned approximately 120 degrees apart, the angular positioning can vary with the design parameters of the assembly 10 and the carousel 100. In yet another embodiment, the chamber 10 includes a loading station 505 and a distinct unloading station (not shown) wherein the thermally processed workpiece W is rotated to from the cooling station 405 for unloading. In this embodiment, the chamber 10 is enlarged to accommodate the unloading station, as well as the loading, heating and cooling stations 505, 305, 405.

As mentioned above, the chamber 10 includes two inductive sensors 364, 464 that indicate and communicate the position of the heater and cooling elements 300, 400. The sensors 364, 464 comprise a portion of a control system that monitors and controls a number of functions of the chamber 10, including the operation of the air cylinders 50, the cover assemblies 120, 122, 124, the process fluid assembly 205, the driver assembly 215, the bellows apparatus 312, 412. Furthermore, the control system directs the operation and cycle times of the heating element 300 and the cooling element 400. For example, the control system utilizes a closed-loop temperature sensor to ensure the proper operation of the heating element 300 at a process temperature. The feedback control can be a proportional integral control, a proportional integral derivative control or a multi-variable temperature control.

Referring to FIGS. 14A,B, two annealing chambers 10 are positioned in a stacked configuration within a stand 600. The stand 600 includes a bottom plate 602, a top plate 604 and a plurality of vertical legs 606, 608, 610. A first chamber 10a is positioned above a second chamber 10b, wherein both chambers 10a, b are supported by cross-members 612. To ensure the loading and unloading of workpieces W, the first opening 30 and the second opening 32 of the chambers 10a, b are positioned between legs 606, 608, 610. Similarly, the side wall component 26 of the cover 22 of the chambers 10a, b are positioned between legs 608, 610. When the annealing chambers 10a, b are stacked as shown in FIGS. 14A, B, the throughput of processed workpieces W is increased while maintaining the same footprint as a single annealing chamber 10. A further advantage of the configuration shown in FIGS. 14A, B is a reduction in the number of couplings needed to supply electrical power, process fluid and vacuum air.

In other embodiments, the chamber 10 can have other configurations. For example, the cooling element 400 can utilize another medium to cool the workpiece, such as cold air. The cylinders 50 that actuate the cover assembly 120, 122, 124 can be replaced by an actuator that is non-pneumatic. The chamber 10 can be configured to perform thermal processes other than annealing the workpiece W. For example, the heating element 300 can heat a microelectronic workpiece W to reflow solder on the workpiece W, cure or bake photoresist on the workpiece W, and/or perform other processes that benefit from and/or require an elevated temperature. The heating element 300 can heat the microelectronic workpiece W conductively by contacting the workpiece W directly, and/or conductively via an intermediate gas or liquid, and/or convectively via an intermediate gas or liquid, and/or radiatively. Similarly, the cooling element 300 can cool the workpiece W conductively by contacting the workpiece W directly, and/or conductively via an intermediate gas or liquid, and/or convectively via an intermediate gas or liquid, and/or radiatively.

The operation and thermal processing of a workpiece W in the chamber 10 is explained with reference to above FIGS. 1–13. The method to thermally process microelectronic workpieces W in the chamber 10 commences with the step of placing a workpiece W into the loading position P0 at the loading station 505 of the carousel assembly 100 with the device side facing away from the base 24. In the loading position P0, the workpiece W is positioned over a loading area 24c of the base 24 (see FIG. 13B). Referring to FIG. 2, in a preferred embodiment the frame 102 has three receivers 104, 106, 108; thus three workpieces W can be sequentially loaded into the carousel assembly 100 for thermal processing. To reach the loading position P0, the cover assembly 120, 122, 124 is moved from its closed position to the open position by engagement of the pedestal 54 of the air cylinder 50 with the cover control arm 128. Specifically, the air cylinder 50 raises the shaft 52 in a substantially vertical direction which causes the pedestal 54 to engage and elevate the terminal end 138 of the control arm 128 thereby raising the cover plate 126. When the pedestal 54 engages the terminal end 138, the links 132 cause the control arm 128 to pivot about the mounting bracket 130 and thereby raise the cover plate 126 a distance sufficient to permit insertion of the workpiece W. After the workpiece W has been placed in the receiver 104, 106, 108, the cover plate 126 is lowered to the closed position by the air cylinder 50.

While the workpiece W is the loaded position P0, the process fluid distribution assembly 205 distributes a measured quantity of process air, such as nitrogen, through the passageway 231, the cover assembly 120, 122, 124 and the distribution block 134 to the workpiece W to purge impurities. The cycle time for the process fluid is approximately 15–25 seconds. Once a sufficient quantity of process fluid is provided, the process fluid distribution assembly 205 can deliver a second process fluid, for example, 1 to 30 liters per minute of a non-oxidizing gas, e.g., nitrogen, argon, hydrogen or helium, through the passageway 231 to aid with the subsequent thermal processing of the workpiece W. When the process fluid is supplied at more than one flow rate, the chamber 10 can include a mass flow controller and/or a multi-port manifold with a valve to selectively control the flow of fluid into the chamber 10. After a sufficient amount of process fluid is delivered by the process fluid distribution assembly 205 through the passageway 231 to the workpiece W in the loading station 505, the driver assembly 215 rotates the carousel assembly 100 to the first position P1, wherein the workpiece W is positioned above the heating element 300 in the heating station 305. Rotation of the carousel assembly 100 to move the workpiece W from the loaded position P0 to the first position P1 consumes approximately 1–3 seconds. As the chamber 10 is configured in FIGS. 1–13, the carousel assembly 100 rotates in a counter-clockwise direction. However, the chamber 10 can be configured to permit clockwise rotation of the carousel assembly 100.

In one embodiment, to maintain a controlled processing environment, the cover plate 126 remains in the closed position as the workpiece W is rotated between the loaded position P0, the first position P1 where the heating element 300 is engaged, and the second position P2 where the cooling element 400 is engaged and the workpiece W is subsequently unloaded from the chamber 10. In another embodiment, the process fluid assembly 205 delivers a quantity of process fluid through the passageways 231 at each of the loaded position P0, the first position P1 and the second position P2. In yet another embodiment, the process fluid assembly 205 selectively delivers a quantity of process fluid through the passageways 231 at the loaded position P0, the first position P1 or the second position P2.

In the first position P1, the bellows assembly 312 raises or moves the heating element 300 from the base 24 of the housing 20 into the use position, wherein the heating element 300 is in thermal engagement with the workpiece W. The bellows assembly 312 takes approximately 1–3 seconds to raise and then subsequently lower the heater element 300. Preferably, in the use position, the heating surface 304 is in direct contact with the non-device side of the workpiece W thereby eliminating the clearance C. Alternatively, in the use position, the heating surface 304 is in close proximity to the non-device side of the workpiece W thereby significantly reducing the clearance C. To maintain a vacuum seal engagement between the workpiece W and the heating surface 304 of the heater element 300, a vacuum is applied via the vacuum channels 318.

To thermally process components of the workpiece W, such as copper micro-structures, the heating element 300 operates at a selected process temperature for a specific period of time to define a heating cycle. Because the chamber 10 has distinct heating and cooling elements 300, 400, the heating element 300 does not need to be ramped-up or increased from an idle temperature to the process temperature. In contrast to conventional processing devices in which a heat source requires a temperature ramp-up, the heating element 300 can be maintained at or near the process temperature which increases the operating efficiency and life of the heating element 300. Since the heating element 300 is in thermal engagement with the workpiece W, the process temperature of the heating element 300 and the process temperature of the workpiece W are substantially similar. For example, when the workpiece W includes a copper layer, the heater element 300, with a process temperature ranging between 150 to 450 degrees Celsius, heats the workpiece W to a temperature in the range of 150 to 450 degrees Celsius for a cycle time ranging between 15 to 300 seconds. In one specific example, the workpiece W, including the copper layer therein, is heated to approximately 250 degrees Celsius for a cycle time of roughly 60 seconds. Accordingly, the copper layer can be annealed such that the grain structure of the layer changes (e.g., the size of the grains forming the layer can increase). In other embodiments, the workpiece W can be heated to a different temperature for another cycle time depending on the chemical composition of the workpiece W material to be thermally processed. The process temperature of the heater element 300 is controlled using a closed-loop temperature sensor feedback control incorporated into the chamber control system 600, such as a proportional integral control, a proportional integral derivative control or a multi-variable temperature control.

Upon expiration of the heating cycle time, the bellows assembly 312 lowers the heating element 300 to its original position with respect to the base 24. The inductive sensor 364 monitors the position of the heating element 300 and communicates this information to the chamber control system 600. The sensor 364 and the control system 600 prevent further rotation of the carousel assembly 100 until the bellows assembly 312 has returned the heating element 300 to its original position. Therefore, once the sensor 364 detects that the heating element 300 has been lowered to its original position and the clearance C has been achieved, the driver assembly 215 rotates the carousel assembly 100 to the second position P2, wherein the workpiece W is positioned above the cooling element 400 in the heating station 405. Rotation of the carousel assembly 100 to move the workpiece W from the first position P1 to the second position P2 consumes approximately 1–3 seconds. While a first workpiece W is in the first position P1 and the heating element 300 is in the heating cycle, a second workpiece W can be placed in the loaded position P0 in a manner consistent with that explained above.

In the second position P2, the bellows apparatus 412 raises or moves the cooling element 400 from the base 24 of the housing 20 into thermal engagement with the workpiece W. In the second position P2, the bellows apparatus 412 raises or moves the cooling element 400 from the base 24 of the housing 20 into the use position, wherein the cooling element 400 is in thermal engagement with the workpiece W. Preferably, in the use position, the cooling surface 404 is direct contact with the non-device side of the workpiece W thereby eliminating the clearance C. Alternatively, in the use position, the cooling surface 404 is in close proximity to the non-device side of the workpiece W thereby significantly reducing the clearance C. To maintain the thermal engagement between the workpiece W and the cooling surface 404 of the cooling element 400, a vacuum is applied via the vacuum channels 418.

The cooling system 430 of the cooling element 400 is then activated to cool the workpiece W to a selected temperature for a specific period of time, the cooling cycle time. For example, when the workpiece W includes a copper layer, the workpiece W can be cooled to a temperature below 70 degrees Celsius with a cycle time ranging between 15–25 seconds. During the cooling cycle, the cooling system 430 circulates the cooling medium through the fluid passageway defined by the internal annular channels 432 of the cooling element 400. Compared to the heater element 300, the cooling element 400 has a reduced cycle time. Because the process fluid cycle time and the cycle time of the cooling element 400 are less than the cycle time of the heating element 300, there is sufficient time for an unprocessed workpiece W to be loaded into the loading station 505 and for a processed workpiece W to be unloaded from the cooling station 405. Consequently, the throughput of the chamber 10 is only dependent upon the cycle time of the heater element 300.

Upon expiration of the cooling cycle, the bellows assembly 412 lowers the cooling element 400 to its original position with respect to the base 24. The inductive sensor 464 monitors the position of the cooling element 400 and communicates this information to the chamber control system 600. The sensor 464 and the control system 600 prevent further rotation of the carousel assembly 100 until the bellows assembly 412 has returned the cooling element 400 to its original position. After the cooling cycle time is complete, the process fluid assembly 205 can replace the process gas with a flow of purge gas. In one embodiment, once the sensor 464 detects that the cooling element 400 has been lowered to its original position, the cover assembly 120, 122, 124 is moved from its closed position to the open position by engagement of the pedestal 54 of the air cylinder 50 with the cover control arm 128 as explained above. After the cover assembly 120, 122, 124 reaches the open position, the workpiece W is removed from the receiver 104, 106, 108, preferably by a robot. In another embodiment, the driver assembly 215 rotates the carousel assembly 100 to the loaded position P0, wherein the cover assembly 120, 122, 124 is moved to the open position and the workpiece W is removed from the receiver 104, 106, 108. While a first workpiece W is in the second position P2 and the cooling element 400 is in the cooling cycle, a second workpiece W is in the first position P1 and a third workpiece W is in the loaded position P0.

As explained above, the chamber 10 provides for the sequential thermal processing of a number of workpieces $W_N$. In one embodiment, the frame 102 of the chamber 10 has three receivers 104, 106, 108 and as a result, the chamber 10 has the capacity to process three distinct workpieces W at one time. As an example of the processing sequence, the first cover assembly 120 is moved to the open position and a first workpiece W1 is inserted in the first receiver 104 and placed in the loading position P0 at the loading station 505. There, the process fluid assembly 205 distributes process fluid through the passageway 231 to the workpiece W1 to remove impurities. After a sufficient amount of process gas is delivered to the first workpiece W1, the driver assembly 215 rotates the carousel assembly 100 approximately 120 degrees to move the first workpiece W1 from the loading position P0 to the first position P1.

When the first workpiece W1 reaches the first position P1, the second cover assembly 122 is moved to the open position and a second workpiece W2 is inserted in the second receiver 106 and placed in the loading position P0 at the loading station 505. In the loading position P0, the process fluid assembly 205 distributes process fluid to the second workpiece W2 to remove impurities and the second workpiece W2 is readied for further processing. In the first position P1, the bellows assembly 312 raises the heating element 300 to the use position, wherein the heating element 300 is in thermal engagement with the first workpiece W1. To maintain the thermal engagement between the first workpiece W1 and the heating surface 304 of the heater element 300, a vacuum is applied via the vacuum channels 318. The heating element 300 is then activated to the process temperature to thermally process components of the first workpiece W1. Upon expiration of the heating cycle time, the bellows assembly 312 lowers the heating element 300 to its original position with respect to the base 24. Once the inductive sensor 364 detects that the heating element 300 has been lowered to its original position, the driver assembly 215 rotates the carousel assembly approximately 120 degrees which moves the first workpiece W1 to the second position P2 and the second workpiece W2 to the first position P1.

When the first workpiece W1 reaches the second position P2 and the second workpiece W2 reaches the first position P1, the third cover assembly 124 is moved to the open position and a third workpiece W3 is inserted in the third receiver 108 and placed in the loading position P0 at the loading station 505. In the loading position P0, the process fluid assembly 205 distributes process fluid through the passageway 231 to the third workpiece W3 to remove impurities and the third workpiece W3 is readied for further processing. In the first position P1, the bellows assembly 312 raises or moves the heating element 300 to the heater use position, wherein the heating element 300 is in thermal engagement with the second workpiece W2. To maintain the thermal engagement between the second workpiece W2 and the heating surface 304 of the heater element 300, a vacuum is applied via the vacuum channels 318. The heating element 300 is then activated to the process temperature to thermally process components of the first workpiece W2. Upon expiration of the heating cycle time, the bellows assembly 312 lowers the heating element 300 to its original position with respect to the base 24. In the second position P2, the bellows apparatus 412 moves the cooling element 400 to the use position, wherein the cooling element 400 is in thermal engagement with the first workpiece W1. The cooling system 400 of the cooling element 400 is then activated to cool the first workpiece W1 to the desired temperature. During the cooling cycle, the cooling system 400 circulates the cooling medium through the fluid passageway defined by the internal annular channels 432 of the cooling element 400. Upon expiration of the cooling cycle, the bellows assembly 412 lowers the cooling element 400 to its original position with respect to the base 24. The inductive sensor 464 monitors the position of the cooling element 400 and communicates this information to the chamber control system 600. After the inductive sensor 464 detects that the cooling element 400 has been lowered to its original position the first cover assembly 120 is moved from its closed position to the open position and the first workpiece W1 is removed from the first receiver 104. Next, the first cover assembly 120 is moved to the closed position and the driver assembly 215 rotates the carousel assembly approximately 120 degrees whereby the second workpiece W2 is moved to the second position P2 and the third workpiece W3 is moved to the first position P1.

After the first workpiece W1 is removed from the chamber 10 and when the second workpiece W2 reaches the second position P2 and the third workpiece W3 reaches the first position P1, the first cover assembly 120 is moved to the open position and a fourth workpiece W4 is inserted in the first receiver 104 and placed in the loading position P0 at the loading station 505. In the loading position P0, the process fluid assembly 205 distributes process fluid through the passageway 231 to the fourth workpiece W4 to remove impurities and the fourth workpiece W4 is readied for further processing. In the first position P1, the bellows assembly 312 raises or moves the heating element 300 to the heater use position, wherein the heating element 300 is in thermal engagement with the third workpiece W3. To maintain the thermal engagement between the third workpiece W3 and the heating surface 304 of the heater element 300, a vacuum is applied via the vacuum channels 318. The heating element 300 is then activated to the process temperature to thermally process components thereof. Upon expiration of the heating cycle, the bellows assembly 312 lowers the heating element 300 to its original position with respect to the base 24. In the second position P2, the bellows apparatus 412 moves the cooling element 400 to the use position, wherein the cooling element 400 is in thermal engagement with the second workpiece W2. The cooling system 400 of the cooling element 400 is then activated to cool the second workpiece W2 to the desired temperature. During the cooling cycle, the cooling system 400 circulates the cooling medium through the fluid passageway defined by the internal annular channels 432 of the cooling element 400. Upon expiration of the cooling cycle, the bellows assembly 412 lowers the cooling element 400 to its original position with respect to the base 24. The inductive sensor 464 monitors the position of the cooling element 400 and communicates this information to the chamber control system 600. After the inductive sensor 464 detects that the cooling element 400 has been lowered to its original position, the second cover assembly 122 is moved from its closed position to the open position and the second workpiece W2 is removed from the second receiver 106. Next, the second cover assembly 122 is moved to the closed position and the driver assembly 215 rotates the carousel assembly approximately 120 degrees whereby the third workpiece W3 is moved to the second position P2 and the fourth workpiece W4 is moved to the first position P1.

After the second workpiece W2 is removed from the chamber 10 and when the third workpiece W3 reaches the second position P2 and the fourth workpiece W4 reaches the first position P1, the second cover assembly 122 is moved to the open position and a fifth workpiece W5 is inserted in the second receiver 106 and placed in the loading position P0 at the loading station 505. The thermal processing sequence of the third, fourth and fifth workpieces W3, 4, 5 is consistent with that explained in the foregoing paragraphs. Consequently, the chamber 10 provides for the sequential thermal processing of multiple workpieces, from the first workpiece W1 to a number of workpieces $W_N$.

From the foregoing, it will be appreciated that specific embodiments of the invention have been described herein for purposes of illustration, but that various modifications may be made without deviating from the spirit and scope of the invention, including, but not limited to, variations in size, materials, shape, form, function and manner of operation, assembly and use.

What is claimed is:

1. An apparatus for thermally processing a microelectronic workpiece, the apparatus comprising:
   a rotatable carousel assembly having a frame with a receiver positioned radially outward of a central opening of the carousel, the receiver configured to support at least one workpiece;
   a loading station;
   a heating station;
   a cooling station; and,
   a driver coupled to the carousel assembly for rotation of the workpiece between the loading, heating and cooling stations, the driver aligned with the central opening of the frame.

2. The thermal processing apparatus of claim 1, wherein the receiver has at least one tab extending radially inward from a curvilinear inner edge of the receiver, the tab being configured to support the workpiece.

3. The thermal processing apparatus of claim 1, wherein the carousel assembly has a cover assembly operably connected to the frame.

4. The thermal processing apparatus of claim 3, wherein the cover assembly is moveable between a closed position wherein the cover assembly covers the receiver, and an open position wherein the cover assembly is elevated with respect to the frame to permit insertion of the workpiece into the receiver.

5. The thermal processing apparatus of claim 3, wherein the cover assembly includes a control arm with a first portion pivotally connected to the frame and a second portion that engages an actuator to move the cover assembly from a closed position to an open position.

6. The thermal processing apparatus of claim 1, wherein the loading station is defined by an extent of a frame of the carousel assembly.

7. The thermal processing apparatus of claim 1, wherein the heating station comprises a heater assembly having a heater element positioned below the carousel assembly and an actuator for moving the heater element into thermal contact with the workpiece.

8. The thermal processing apparatus of claim 7, wherein the heater assembly includes a sensor that monitors a position of the heater element to prevent rotation of the carousel assembly until the actuator moves the heater element away from the workpiece.

9. The thermal processing apparatus of claim 1, wherein the cooling station comprises a cooling assembly having a cooling element positioned below the carousel assembly and an actuator for moving the cooling element into thermal contact with the workpiece.

10. The thermal processing apparatus of claim 9, wherein the cooling element comprises a channel that defines a fluid passageway.

11. The thermal processing apparatus of claim 9, wherein the cooling assembly further comprises a sensor that monitors a position of the cooling element to prevent rotation of the carousel assembly until the actuator moves the cooling element away from the workpiece.

12. The thermal processing apparatus of claim 1, wherein the carousel assembly comprises a process fluid distribution system for delivering process fluid to the loading, heating and cooling stations.

13. The thermal processing apparatus of claim 12, wherein the process fluid is a gas.

14. The thermal processing apparatus of claim 12, wherein the process fluid is a non-oxidizing gas.

15. The thermal processing apparatus of claim 12, wherein the process fluid is nitrogen.

16. The thermal processing apparatus of claim 12, wherein the process fluid comprises approximately 90–97% by volume argon and approximately 3–10% by volume hydrogen.

17. The thermal processing apparatus of claim 12, wherein the process fluid comprises approximately 90–98% by volume nitrogen and approximately 2–10% by volume hydrogen.

18. An apparatus for thermally processing microelectronic workpieces, the apparatus comprising:
a rotatable carousel assembly having a frame with a receiver configured to support a workpiece and a cover assembly operably connected to the frame, the cover assembly having a cover plate that overlies the receiver and the workpiece;
a heating station;
a cooling station, wherein the heating and cooling stations are positioned radially outwardly from a central axis of the carousel assembly; and,
a driver coupled to the carousel assembly to selectively rotate the workpieces between the heating station and the cooling station, wherein the cover plate remains over the receiver and workpiece during rotation between the heating and cooling stations.

19. The thermal processing apparatus of claim 18, wherein the receiver has at least one tab extending radially inward from an inner edge of the receiver, the tab being configured to engage a non-device side of the workpiece and support the workpieces in a substantially horizontal arrangement.

20. The thermal processing apparatus of claim 18, wherein the cover assembly is moveable between a closed position wherein the cover assembly covers the receiver, and an open position wherein the cover assembly is elevated with respect to the receiver to permit insertion of a workpiece into the receiver.

21. The thermal processing apparatus of claim 20, wherein the cover assembly includes a control arm with a first portion pivotally connected to the frame and a second portion that engages an actuator to move the cover assembly from the closed position to the open position.

22. The thermal processing apparatus of claim 18, wherein the heating station comprises a heater assembly having a heater element positioned below the frame of the carousel assembly and an actuator for moving the heater element into thermal contact with one of the workpieces.

23. The thermal processing apparatus of claim 22, wherein the heater assembly further comprises a sensor that monitors a position of the heater element to prevent rotation of the carousel assembly until the actuator moves the heater element away from the one of the workpieces.

24. The thermal processing apparatus of claim 18, wherein the cooling station comprises a cooling assembly having a cooling element positioned below the frame of the carousel assembly and an actuator for moving the cooling element into thermal contact with one of the workpieces.

25. The thermal processing apparatus of claim 24, wherein the cooling element comprises a channel that defines a fluid passageway.

26. The thermal processing apparatus of claim 24, wherein the cooling assembly further comprises a sensor that monitors a position of the cooling element to prevent rotation of the carousel assembly until the actuator moves the cooling element away from the one of the workpieces.

27. The thermal processing apparatus of claim 22, wherein the actuator comprises a bellows.

28. The thermal processing apparatus of claim 24, wherein the actuator comprises a bellows.

29. An apparatus for thermally processing microelectronic workpieces, the apparatus comprising:
a base having a heating element and a cooling element;
a rotatable carousel assembly having a frame configured to support a plurality of workpieces above the base; and,
a driver coupled to the carousel assembly for rotation of the carousel assembly between a first position, wherein one of the plurality of workpieces is in thermal contact with the heating element that has been elevated towards the workpiece from an initial position below the workpiece, and a second position, wherein the one of the plurality of workpieces is in thermal contact with the cooling element that has been elevated towards the workpiece from an initial position below the workpiece.

30. The thermal processing apparatus of claim 29, further comprising a process fluid distribution system extending through a central opening in the carousel assembly, wherein the distribution system delivers process fluid to the workpieces.

31. The thermal processing apparatus of claim 30, wherein the process fluid is a gas.

32. The thermal processing apparatus of claim 30, wherein the process fluid is a non-oxidizing gas.

33. The thermal processing apparatus of claim 30, wherein the process fluid is nitrogen.

34. The thermal processing apparatus of claim 30, wherein the process fluid comprises approximately 90–97% by volume argon and approximately 3–10% by volume hydrogen.

35. The thermal processing apparatus of claim 30, wherein the process fluid comprises approximately 90–98% by volume nitrogen and approximately 2–10% by volume hydrogen.

36. The thermal processing apparatus of claim 29, wherein in the first position, another one of the plurality of workpieces is in thermal contact with the cooling element.

37. The thermal processing apparatus of claim 29, wherein in the second position, another one of the plurality of workpieces is in thermal contact with the heating element.

38. An apparatus for thermally processing a microelectronic workpiece, the apparatus comprising:
 a rotatable carousel assembly configured to support the workpiece, wherein the carousel assembly rotates the workpiece between a loading station, a heating station, and a cooling station; and,
 a process fluid distribution system coupled to the carousel assembly and having a manifold with a passageway for delivering process fluid to the workpiece, wherein the manifold rotates with the carousel between the loading, heating and cooling stations.

39. The thermal processing apparatus of claim 38, wherein the heating station comprises a heating element positioned below the carousel assembly and an actuator for moving the heater element into thermal contact with the workpiece.

40. The thermal processing apparatus of claim 39, wherein the heating station further comprises a sensor for determining a position of the heater element.

41. The thermal processing apparatus of claim 39, wherein the heating station further comprises a sensor for determining a temperature of the heating element.

42. The thermal processing apparatus of claim 40, wherein the carousel assembly rotates based upon the sensed position of the heater element.

43. The thermal processing apparatus of claim 38, wherein the cooling station comprises a cooling element positioned below the carousel assembly and an actuator for moving the cooling element into thermal contact with the workpiece.

44. The thermal processing apparatus of claim 43, wherein the cooling station further comprises a sensor for determining a position of the cooling element.

45. The thermal processing apparatus of claim 43, wherein the cooling station further comprises a sensor for determining a temperature of the cooling element.

46. The thermal processing apparatus of claim 44, wherein the carousel assembly rotates based upon the sensed position of the cooling element.

47. The thermal processing apparatus of claim 38, wherein the manifold extends through a central opening in the carousel assembly, the manifold having at least one discharge port in fluid communication with the carousel assembly.

48. The thermal processing apparatus of claim 38, wherein the process fluid distribution system comprises a stationary input sleeve with at least one opening that receives process fluid from a supply line.

49. The thermal processing apparatus of claim 38, wherein the process fluid distribution system comprises:
 an input sleeve having an annular channel for receiving the process fluid from a supply source; and
 wherein the manifold is connected to the input sleeve for selective distribution of the process fluid to the workpiece at the loading, heating, and cooling stations.

50. The thermal processing apparatus of claim 49, further comprising a driver coupled to the carousel and the process fluid distribution system for rotation of the workpiece between the loading, heating, and cooling stations.

51. An apparatus for thermally processing microelectronic workpieces, the apparatus comprising:
 a rotatable carousel assembly having a plurality of receivers wherein each receiver supports a workpiece in a substantially horizontal position during rotation of the carousel;
 a base positioned below the carousel assembly and having a heating element and a cooling element, wherein each of the heating element and the cooling element include an actuator that elevates the element upwards towards the receiver and the workpiece; and,
 a driver assembly coupled to the carousel assembly for rotation of the carousel assembly between an initial loading position, a first position wherein the actuator elevates the heating element into thermal contact with the workpiece, and a second position wherein the actuator elevates the cooling element into thermal contact with the workpiece.

52. The thermal processing apparatus of claim 51, wherein the heating element includes an upper portion with a heating surface having an arrangement of vacuum channels.

53. The thermal processing apparatus of claim 52, wherein the heating element has a lower portion that is positioned below the base and that contains the actuator.

54. The thermal processing apparatus of claim 53, wherein the actuator elevates the upper portion of the heating element from an initial position where a clearance exists between the workpiece and the heating surface, to a use position where thermal contact occurs to process the workpiece.

55. The thermal processing apparatus of claim 51, wherein the cooling element includes an upper portion with a cooling surface having an arrangement of vacuum channels.

56. The thermal processing apparatus of claim 55, wherein the cooling element has a lower portion that is positioned below the base and that contains the actuator.

57. The thermal processing apparatus of claim 56, wherein the actuator elevates the upper portion of the cooling element from an initial position where a clearance exists between the workpiece and the cooling surface, to a use position where thermal contact occurs to process the workpiece.

58. The thermal processing apparatus of claim 51, wherein the cooling element includes a plurality of internal channels that define a passageway for a cooling medium utilized during operation of the cooling element.

59. An apparatus for thermally processing microelectronic workpieces, the apparatus comprising:
 a rotatable carousel assembly having a frame with a plurality of receivers wherein each receiver supports a workpiece during rotation of the carousel, the receivers positioned radially outward of a central opening of the frame;
 a base positioned below the carousel and having a heating station with a heating element and a cooling station with a cooling element;

a driver assembly operably connected to the frame for rotation of the workpieces between the heating and cooling stations; and, a process fluid distribution assembly extending upward from the base through the central opening of the frame, the processed fluid distribution assembly having both an input sleeve fixedly connected to the base and a manifold connected to the frame wherein the manifold rotates with the frame and supplies process fluid to each workpiece at the heating and cooling stations.

60. The thermal processing apparatus of claim 59, wherein the manifold extends through the central opening and wherein the driver assembly includes a rotatable shaft operably connected to the manifold.

61. The thermal processing apparatus of claim 59, wherein the input sleeve has an internal channel and the manifold has an internal channel, wherein the internal channels are aligned to define a passageway for the flow of a process fluid through the input sleeve and the manifold to the workpiece.

62. The thermal processing apparatus of claim 61, wherein the process fluid distribution assembly includes a purge line extending between the manifold and the frame, wherein process fluid is delivered from the manifold through the purge line to a workpiece supported by a receiver.

63. The thermal processing apparatus of claim 59, wherein the carousel assembly includes a cover assembly operably connected to the frame for each receiver, the cover assembly having a cover plate that overlies the workpiece and remains over the workpiece during rotation between the heating and cooling stations.

64. The thermal processing apparatus of claim 63, wherein the process fluid distribution assembly includes a purge line for each cover assembly, wherein each purge line extends between the manifold and the cover plate, and wherein process fluid is delivered from the manifold through the purge line and the cover plate to a workpiece supported by a receiver.

65. The thermal processing apparatus of claim 63, wherein each cover plate assembly includes a control arm affixed to the cover plate and pivotally connected to the frame.

66. The thermal processing apparatus of claim 65, wherein the base includes an air cylinder in each of the heating and cooling stations, and wherein the air cylinder engages a portion of the control arm to move the cover assembly between an open position and closed position thereby providing access to the workpiece.

* * * * *